United States Patent
Toda

(10) Patent No.: US 8,552,415 B2
(45) Date of Patent: Oct. 8, 2013

(54) SOLID-STATE IMAGING DEVICE, METHOD FOR MANUFACTURING SOLID-STATE IMAGING DEVICE, AND IMAGING APPARATUS

(75) Inventor: Atsushi Toda, Kanagawa (JP)

(73) Assignee: Sony Corporation (JP)

( * ) Notice: Subject to any disclaimer, the term of this patent is extended or adjusted under 35 U.S.C. 154(b) by 182 days.

(21) Appl. No.: 12/692,982

(22) Filed: Jan. 25, 2010

(65) Prior Publication Data

US 2010/0187501 A1   Jul. 29, 2010

(30) Foreign Application Priority Data

Jan. 29, 2009 (JP) .................. 2009-017470

(51) Int. Cl.
*H01L 31/18* (2006.01)
(52) U.S. Cl.
USPC ........ 257/13; 257/E31.033; 438/63; 977/734; 977/774
(58) Field of Classification Search
USPC ........ 257/E31.033, 13; 438/63; 977/734, 774
See application file for complete search history.

(56) References Cited

U.S. PATENT DOCUMENTS

| | | | |
|---|---|---|---|
| 7,147,982 B2 * | 12/2006 | Dickerson et al. | 430/139 |
| 7,468,746 B2 * | 12/2008 | Sugimoto | 348/229.1 |
| 7,476,904 B2 * | 1/2009 | Fukunaga | 257/80 |
| 7,642,711 B2 * | 1/2010 | Araki | 313/506 |
| 7,968,792 B2 * | 6/2011 | Harkness et al. | 136/260 |
| 2005/0150541 A1 * | 7/2005 | Scher et al. | 136/250 |
| 2005/0236035 A1 * | 10/2005 | Yang et al. | 136/263 |
| 2011/0041895 A1 * | 2/2011 | Carroll | 136/250 |

FOREIGN PATENT DOCUMENTS

| | | |
|---|---|---|
| JP | 2005-303284 | 10/2005 |
| JP | 2006-208158 | 8/2006 |
| JP | 2006-245285 | 9/2006 |
| JP | 2007-067194 | 3/2007 |
| JP | 2007-188854 | 7/2007 |
| WO | WO 2007/120216 | 10/2007 |

OTHER PUBLICATIONS

Official Action (with English translation) for Japanese Patent Application No. 2009-017470 mailed May 28, 2013, 10 pages.

* cited by examiner

*Primary Examiner* — John C Ingham
(74) *Attorney, Agent, or Firm* — Sheridan Ross P.C.

(57) ABSTRACT

A solid-state imaging device includes a first electrode, a second electrode disposed opposing to the first electrode, and a photoelectric conversion layer, which is disposed between the first electrode and the second electrode and in which narrow gap semiconductor quantum dots are dispersed in a conductive layer, wherein one electrode of the first electrode and the second electrode is formed from a transparent electrode and the other electrode is formed from a metal electrode or a transparent electrode.

14 Claims, 19 Drawing Sheets

SOLID-STATE IMAGING DEVICE, METHOD FOR MANUFACTURING SOLID-STATE IMAGING DEVICE, AND IMAGING APPARATUS

BACKGROUND OF THE INVENTION

1. Field of the Invention

The present invention relates to a solid-state imaging device, a method for manufacturing the solid-state imaging device, and an imaging apparatus.

2. Description of the Related Art

Along with an increase in the number of pixels of a solid-state imaging device (image sensor), a size reduction of a pixel has been developed.

On the other hand, an improvement of moving image characteristics through high-speed imaging has been developed at the same time.

In the case where the pixel is miniaturized and high-speed imaging is conducted, the number of photons incident on one pixel decreases and desensitization occurs.

Furthermore, regarding a surveillance camera, there is a demand for a camera suitable for photographing in a dark place. Here, a high-sensitivity sensor is desired.

One example of attempts to enhance sensitivity is signal amplification through avalanche multiplication.

For example, there is an attempt to effect avalanche multiplication of photons through application of a high voltage (refer to IEEE Transactions Electron Devices Vol. 44, NO. 10, October, 1997, for example). Here, since a high voltage of 40 V is applied to effect avalanche multiplication, it is difficult to make a pixel finer because of a crosstalk problem and the like. In the case of this sensor, the pixel size is 11.5 µm×13.5 µm.

Moreover, another avalanche multiplication type image sensor has been disclosed (refer to IEEE J. Solid-State Circuits, 40, p. 1847, 2005, for example). Regarding this avalanche multiplication type image sensor, it is desired to apply a voltage of 25.5 V to effect avalanche multiplication. Therefore, in order to avoid crosstalk, a wide guard-ring layer or the like is necessary, and a large pixel size of 58 µm×58 µm is desired.

In this regard, not only the above-described problem in that a high drive voltage is desired to effect avalanche multiplication for enhancing the sensitivity, but also a photon shot noise problem occurs at the same time because of a reduction in the number of photons. That is, since the photon is a Bose particle, overlapping of particles occurs, and in the continuous light, there are parts, in which photons are dense, and parts, in which photons are sparse (photon bunching effect). The noise Nn due to this fluctuation is the square root of the number of photons Ns as represented by the following equation.

$$Nn = \sqrt{Ns}$$

Therefore, the SN ratio becomes Ns/Nn (=√NS), and as the number of photons Ns decreases, the SN ratio decreases at the same time.

This refers to that a proportion of the photon shot noise relative to the signal increases.

In such a case, not only the signal, but also the photon shot noise is amplified at the same time through avalanche multiplication. Consequently, if multiplication is effected while the proportion of the photon shot noise is large, that is, the SN ratio is low, the noise becomes large relatively and the image quality deteriorates significantly.

SUMMARY OF THE INVENTION

The present inventor has recognized that the photon shot noise is amplified together with the signal at the same time through avalanche multiplication.

It is desirable to enhance the sensitivity through avalanche multiplication while photon shot noise is suppressed.

A solid-state imaging device according to an embodiment of the present invention includes a first electrode, a second electrode disposed opposing to the above-described first electrode, and a photoelectric conversion layer, which is disposed between the above-described first electrode and the above-described second electrode and in which narrow gap semiconductor quantum dots are dispersed in a conductive layer, wherein one electrode of the above-described first electrode and the above-described second electrode is formed from a transparent electrode and the other electrode is formed from a metal electrode or a transparent electrode.

Since the solid-state imaging device according to an embodiment of the present invention includes the photoelectric conversion layer, in which narrow gap semiconductor quantum dots are dispersed in the conductive layer, avalanche multiplication can be effected by low voltage drive.

A method for manufacturing a solid-state imaging device, according to an embodiment of the present invention, includes the steps of forming a charge accumulation layer on a silicon substrate, forming a pixel electrode on the above-described charge accumulation layer, forming an insulating film covering the above-described pixel electrode, forming a plug, which is connected to the above-described pixel electrode, in the above-described insulating film, forming a first electrode, which is connected to the above-described plug, on the above-described insulating film, forming a conductive layer, in which narrow gap semiconductor quantum dots are dispersed, on the above-described first electrode, so as to form a photoelectric conversion layer, and forming a second electrode on the above-described photoelectric conversion layer, wherein one electrode of the above-described first electrode and the above-described second electrode is formed from a transparent electrode and the other electrode is formed from a metal electrode or a transparent electrode.

In the method for manufacturing a solid-state imaging device, according to an embodiment of the present invention, the photoelectric conversion layer is formed by forming the conductive layer, in which narrow gap semiconductor quantum dot are dispersed. Therefore, avalanche multiplication can be effected by low voltage drive.

An imaging apparatus according to an embodiment of the present invention includes a light-condensing portion to condense incident light, an imaging portion including a solid-state imaging device to receive and photoelectrically convert the light condensed with the above-described light-condensing portion, and a signal processing portion to process the signal subjected to the photoelectrical conversion, wherein the above-described solid-state imaging device includes a first electrode, a second electrode disposed opposing to the above-described first electrode, and a photoelectric conversion layer, which is disposed between the above-described first electrode and the above-described second electrode and in which narrow gap semiconductor quantum dots are dispersed in a conductive layer, while one electrode of the above-described first electrode and the above-described second electrode is formed from a transparent electrode and the other electrode is formed from a metal electrode or a transparent electrode.

In the imaging apparatus according to an embodiment of the present invention, the solid-state imaging device including the photoelectric conversion layer, in which narrow gap semiconductor quantum dots are dispersed in the conductive layer, is used in the imaging portion. Therefore, avalanche multiplication can be effected by low voltage drive.

Regarding the solid-state imaging device according to an embodiment of the present invention, avalanche multiplication can be effected by low voltage drive. Therefore there is an advantage that the sensitivity of even a fine pixel can be enhanced through multiplication.

In the method for manufacturing a solid-state imaging device, according to an embodiment of the present invention, the photoelectric conversion layer, in which narrow gap semiconductor quantum dots are dispersed in the conductive layer, is formed. Therefore, avalanche multiplication can be effected by low voltage drive, and there is an advantage that a solid-state imaging device, in which the sensitivity of the fine pixel is enhanced, can be produced.

The imaging apparatus according to an embodiment of the present invention includes the high-sensitivity solid-state imaging device. Therefore, imaging can be conducted with high sensitivity. Consequently, there is an advantage that photographing can be conducted with high image quality even in a dark photographing environment, for example, in night photographing, or the like.

DESCRIPTION OF THE PREFERRED EMBODIMENTS

The preferred embodiments (hereafter referred to as embodiment) for executing the present invention will be described below.

1. First Embodiment

Configuration of First Example of Solid-State Imaging Device

A first example of the configuration of a solid-state imaging device according to a first embodiment of the present invention will be described with reference to a schematic configuration sectional view shown in FIG. 1.

Figure 1:
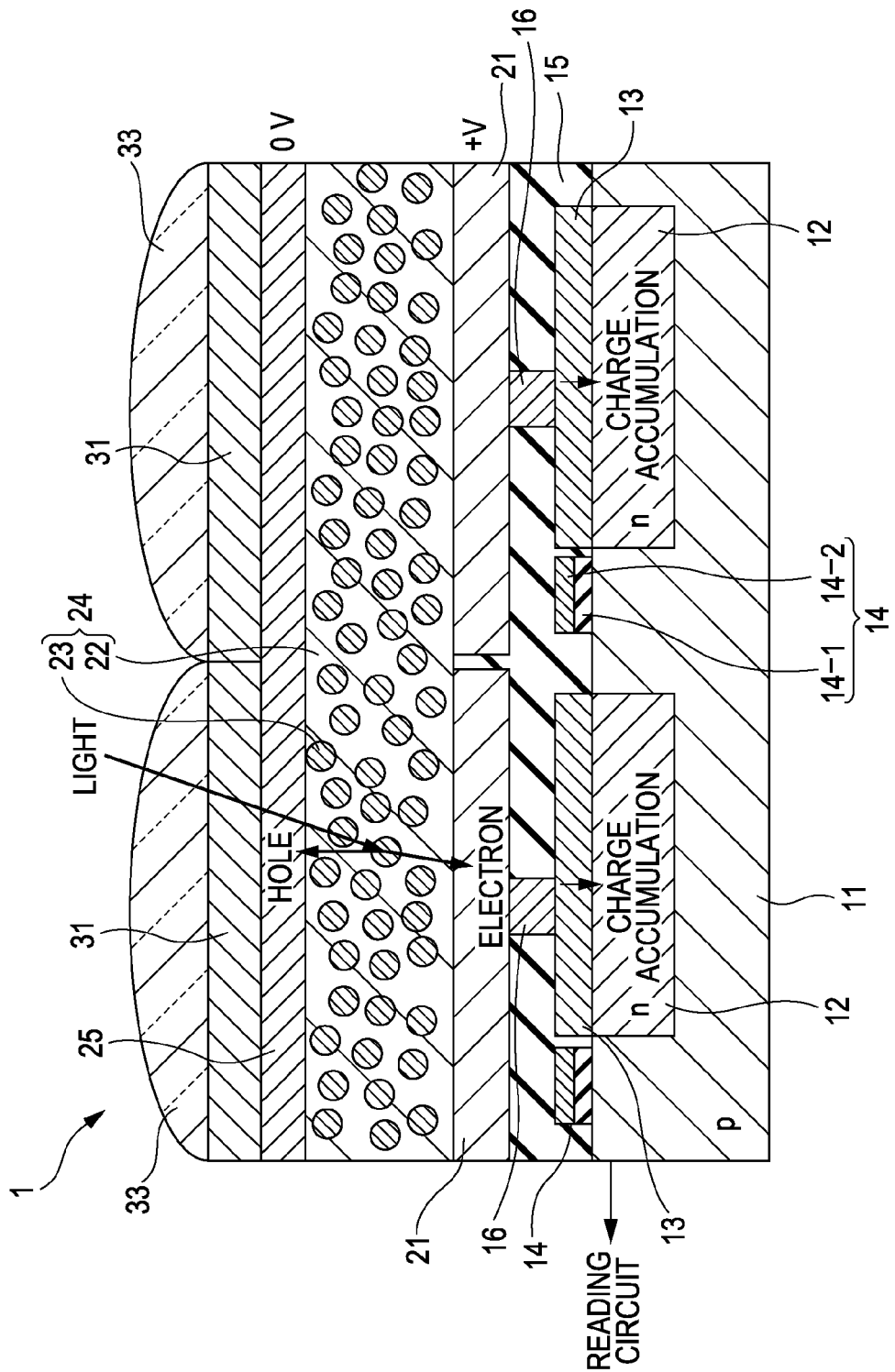
FIG. 1 is a schematic configuration sectional view showing a first example of a solid-state imaging device according to a first embodiment of the present invention.

As shown in FIG. 1, for example, a p-type silicon substrate is used as a silicon substrate 11. A plurality of pixels are disposed on the above-described silicon substrate 11. In the drawing, two pixels are shown as typical examples.

A charge accumulation layer 12 is disposed on the above-described silicon substrate 11 on a pixel basis. This charge accumulation layer 12 is formed from, for example, an n-type impurity diffusion layer. For example, the silicon substrate 11 is doped with an n-type impurity, e.g., phosphorus (P) or arsenic (As), so as to form the charge accumulation layer 12.

Pixel electrode 13 is disposed on the above-described charge accumulation layer 12. Furthermore, a gate MOS 14 to read a signal from the charge accumulation layer 12 to a reading circuit (not shown in the drawing) is disposed, on a pixel basis, on the above-described silicon substrate 11. In this gate MOS 14, a gate electrode 14-2 is disposed on the silicon substrate 11 with a gate insulating film 14-1 therebetween.

An insulating film 15 covering the above-described pixel electrodes 13, the gate MOSs 14, and the like is disposed on the above-described silicon substrate 11. This insulating film 15 is formed from, for example, a silicon oxide film. As a matter of course, the insulating film 15 may be formed from an inorganic insulating film or an organic insulating film other than the silicon oxide film.

Plugs 16 connected to the above-described pixel electrodes 13 are disposed in the above-described insulating film 15. This plug 16 is formed from, for example, tungsten. As a matter of course, electrically conductive materials other than tungsten can be used.

First electrodes 21 connected to the above-described plugs 16 are disposed on the above-described insulating film 15. These first electrodes 21 are disposed separately on a pixel basis. This electrode is formed from a transparent electrode material of, for example, indium tin oxide (ITO), indium zinc oxide, or zinc oxide. Alternatively, this electrode is formed from a metal electrode of lithium fluoride (LiF), calcium, or the like. That is, it is preferable that the metal electrode of the first electrode 21 has a work function smaller than the work function of a conductive layer 22 and the Fermi level of the metal electrode of the first electrode 21 is higher than the HOMO level (or the energy level of a valence band) of the conductive layer 22.

A photoelectric conversion layer 24, in which narrow gap semiconductor quantum dots 23 are dispersed in a conductive layer 22, is disposed on the above-described first electrodes 21.

The narrow gap semiconductor quantum dot 23 is formed in such a way that the band gap is 1 eV or less and the particle diameter is, for example, 10 nm or less. Examples of materials therefor include a lead selenium compound (PbSe), a lead sulfur compound (PbS), a lead tellurium compound (PbTe), a cadmium selenium compound (CdSe), a cadmium tellurium compound (CdTe), an indium antimony compound (InSb), and an indium arsenic compound (InAs).

Furthermore, as for the above-described conductive layer 22, poly2-methoxy-5-(2'-ethylhexyloxy)-1,4-phenylenevinylene (hereafter abbreviated as MEH-PPV) is used.

A second electrode 25 is disposed on the above-described photoelectric conversion layer 24. This second electrode 25 is an electrode on the light-incident side and, therefore, is formed from a transparent electrode of, for example, indium tin oxide (ITO), indium zinc oxide, or zinc oxide, which has a light-transmitting property.

Moreover, color filter layers 31 are disposed on the above-described second electrode 25. In this regard, a transparent insulating film (not shown in the drawing) may be disposed as a base material of the color filter layers 31.

In addition, a condenser lens 33 is disposed, on a pixel basis, on the above-described color filter layer 31.

The solid-state imaging device 1 has the above-described configuration.

Explanation of Avalanche Multiplication of Solid-State Imaging Device

Next, the principle of avalanche multiplication will be described below.

The avalanche multiplication refers to that in the case where an electron or a hole is accelerated and collides with a crystal atom, kinetic energy is given to the crystal, an electron present in a valence band is excited to a conduction band by the given energy and, thereby, a fresh electron-hole pair is yielded. The multiplication occurs significantly by repeating this process.

The above-described solid-state imaging device 1 includes the photoelectric conversion layer 24, in which narrow gap semiconductor quantum dots 23 are dispersed in the conductive layer 22. Therefore, carriers generated through photoelectric conversion are transported in the electrically conductive photoelectric conversion layer 24. Consequently, a multiplication function is performed and the avalanche multiplication can be effected by low voltage drive. Hence, there is an advantage that the sensitivity of even a fine pixel can be enhanced through multiplication.

The reason for a high drive voltage of an avalanche multiplication type solid-state imaging device (image sensor) is that a high electric field is necessary to accelerate electrons or holes generated through photoelectric conversion and, consequently, it is necessary to apply a high voltage.

Therefore, in order to reduce the drive voltage, it is desirable to give the kinetic energy to the electrons or the holes generated through photoelectric conversion by another method.

Figure 2:
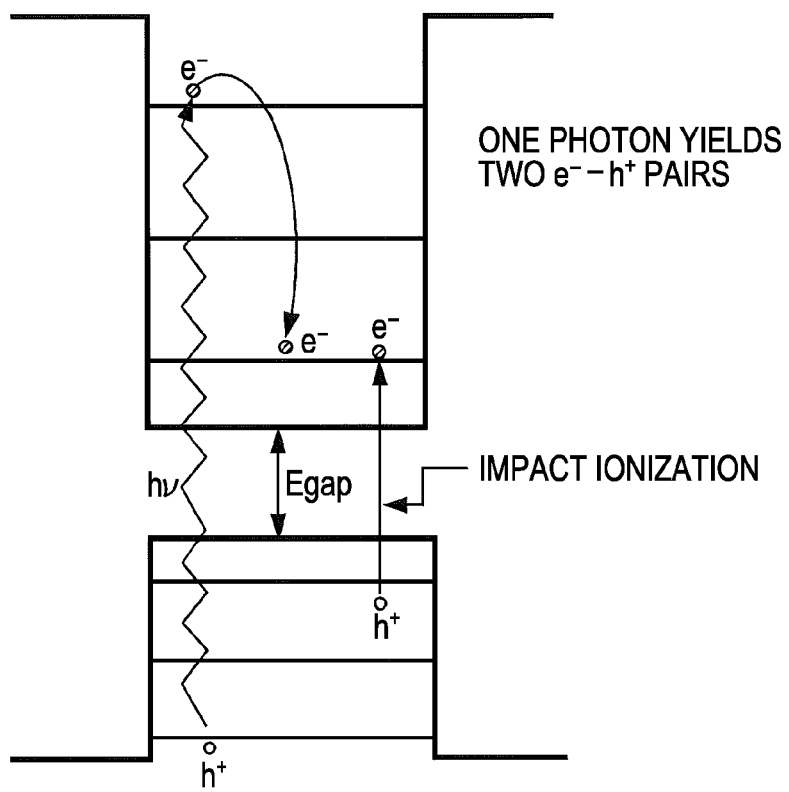
FIG. 2 is a band diagram for explaining avalanche multiplication.

According to a document "PHYSICAL REVIEW LETTERS Vol. 92, Num. 18, 186601 (2004)", as shown in FIG. 2, when light is applied to a narrow gap semiconductor quantum dot, an electron-hole pair is yielded through photoelectric conversion. In the drawing, hv represents light energy, e⁻ represents an electron, h⁺ represents a hole, and $E_{gap}$ represents band gap energy.

At this time, in the case where the condition, (photon energy of incident light)>(band gap of quantum dot), is satisfied, the electron-hole pair has excess kinetic energy. This excess energy is represented by (excess kinetic energy)=(photon energy of incident light)−(band gap of quantum dot).

If this excess kinetic energy is larger than the band gap of quantum dot, an electron present in the valence band is excited again to the conduction band through the collision process and, thereby, another fresh electron-hole pair is yielded. If the excess kinetic energy is m times the band gap of quantum dot or more (where m represents a natural number), that is, the condition, (excess kinetic energy)≥m×(band gap of quantum dot), is satisfied, at least m times of multiplication occurs by the photon energy alone.

In the range of the wavelength of the visible light of 400 nm to 650 nm, the photon energy is within the range of 1.9 eV to 3.1 eV. Here, for example, if a narrow gap semiconductor quantum dot of PbSe (band gap energy: Eg=0.3 eV) is used for photoelectric conversion, 6 times to 10 times of multiplication is possible. As for this multiplication, it is indicated that electric field is not substantially necessary.

Furthermore, besides PbSe described above, multiplication similar to that in the case of PbSe is effected effectively with respect to PbS, PbTe, CdSe, CdTe, InSb, InAs, and the like, which have a band gap of 1 eV or less, as described above.

That is, the above-described solid-state imaging device 1 enables to produce a high-sensitivity sensor compatible with a fine pixel through avalanche multiplication effected by low-voltage drive by application of the above-described avalanche multiplication principle.

Explanation of Current Diffusion of Solid-State Imaging Device

As is described above with reference to FIG. 1, the narrow gap semiconductor quantum dots 23 having particle diameters of 10 nm or less are dispersed in the conductive layer 22 constituting the photoelectric conversion layer 24.

The above-described conductive layer 22 may be formed from an organic electrically conductive polymer material or an electrically conductive low molecular material. Alternatively, inorganic materials having electrical conductivity may be used.

Furthermore, the conductive layer 22, in which the narrow gap semiconductor quantum dots 23 are dispersed, is sandwiched between the second electrode 25, which is a transparent electrode disposed on the light-incident side, and the first electrodes 21 (metal electrodes or transparent electrodes), which are disposed on the side opposite to the light-incident side and which are separated on a pixel basis.

In order to improve the incident efficiency of light and ensure a large opening, a plug 16 is disposed as described above and, thereby, the above-described first electrode 21 is brought into the state of being lifted to a higher level apart from the reading circuit portion of the gate MOS or the like, and the photoelectric conversion layer 24 is disposed all over the surface above the substrate.

The second electrode 25 on the light-incident side is to avoid charging of holes and, therefore, is not necessarily separated on a pixel basis, although may be separated.

Color filter layers 31 for dispersion are disposed on the individual pixels above the above-described second electrode 25.

Here, the conductive layer 22 may be separated on a pixel basis through etching or the like in order to suppress diffusion of the current in a lateral direction. Furthermore, as shown in FIG. 1 described above, light may be condensed on the vicinity of the center of the pixel by disposing the condenser lens 33 as the uppermost portion of each pixel and mainly undergo photoelectric conversion there, so as to suppress diffusion current in the lateral direction.

Figure 3:
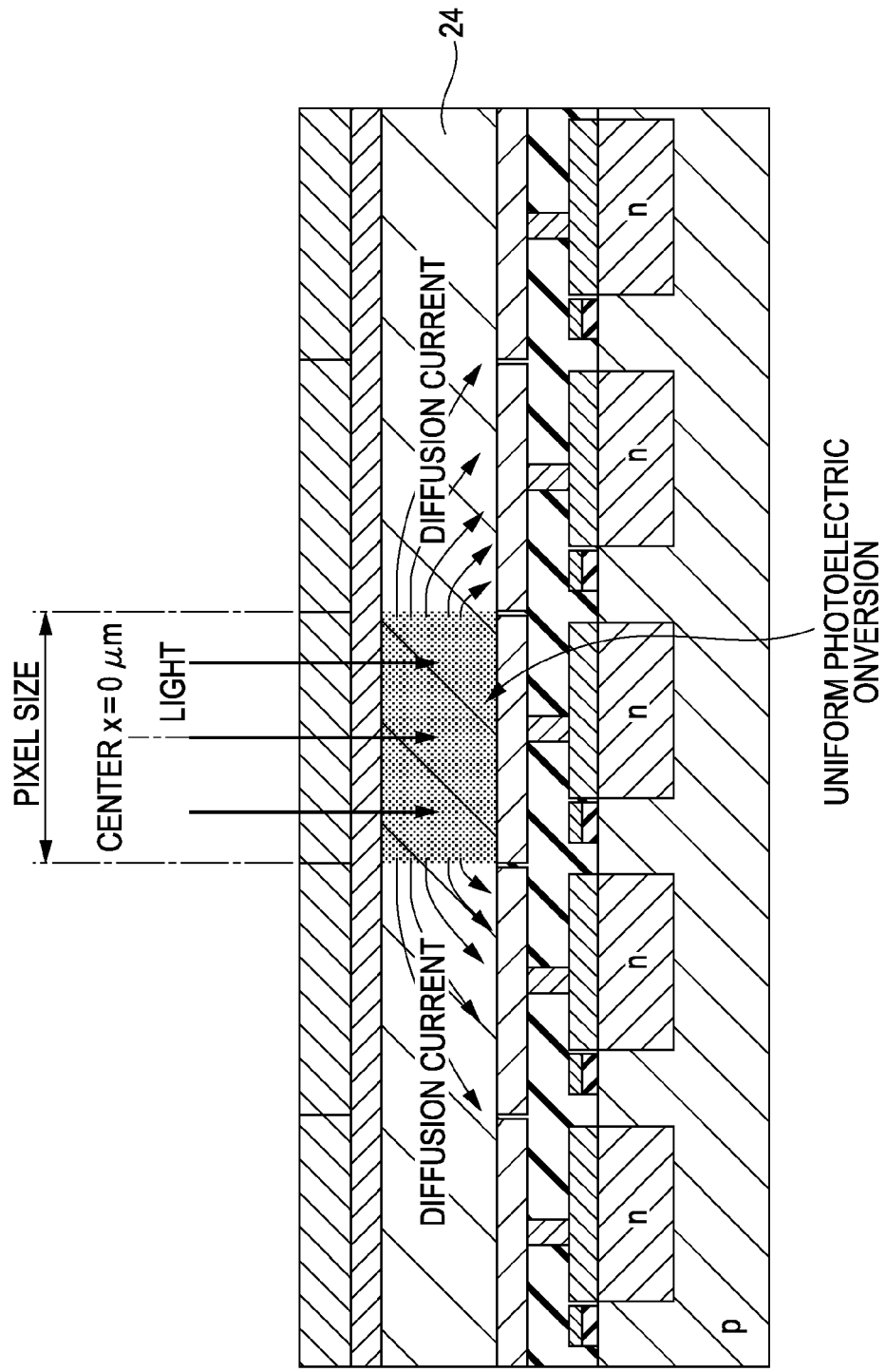
FIG. 3 is a schematic configuration sectional view showing a diffusion current in a lateral direction in the configuration, in which a condenser lens is not disposed.

That is, as shown in FIG. 3, in the configuration, in which a condenser lens is not disposed, the light enters the photoelectric conversion layer 24 uniformly so as to undergo photoelectric conversion, and photoelectrons spread into the lateral direction due to diffusion.

Figure 4:
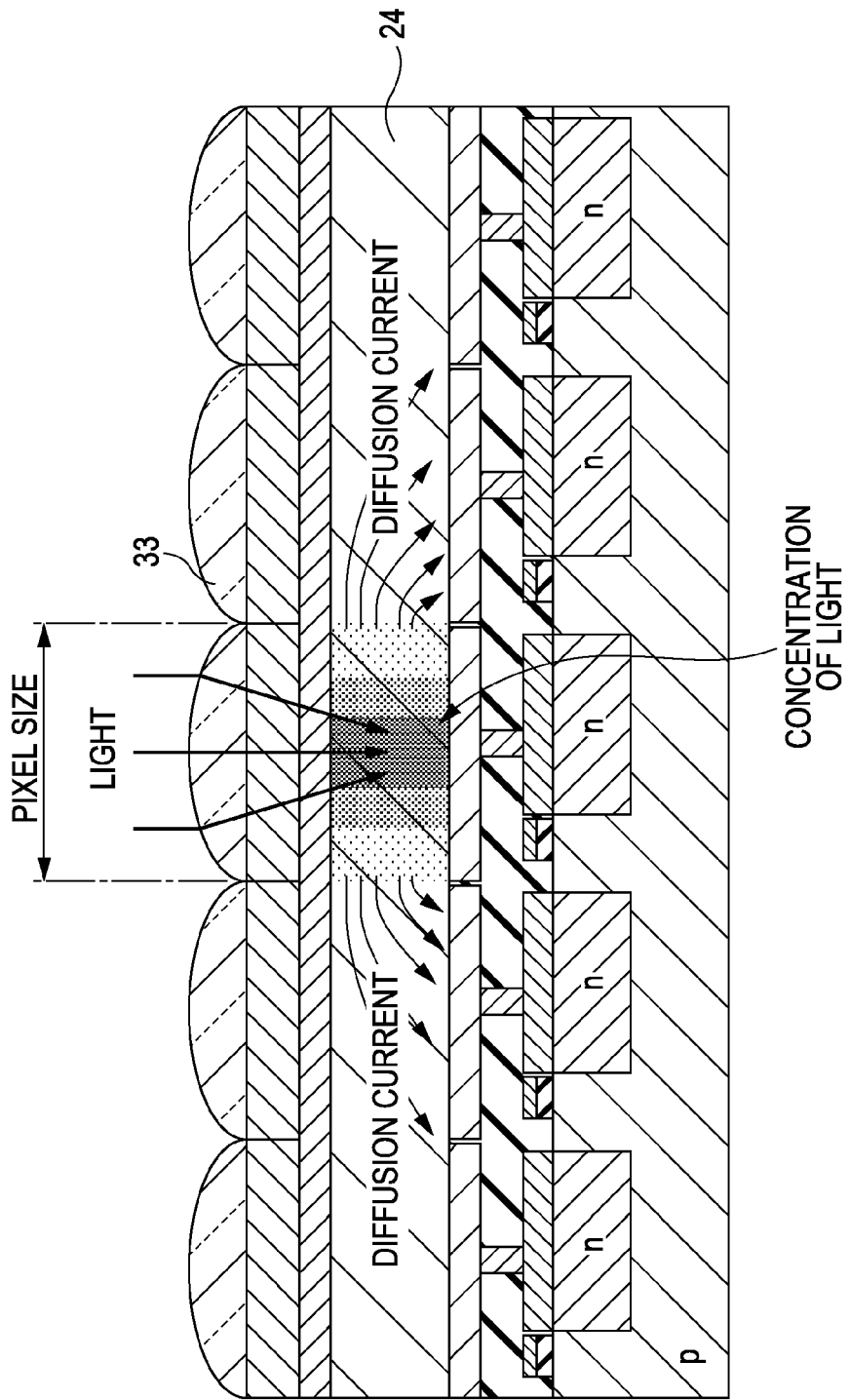
FIG. 4 is a schematic configuration sectional view showing a diffusion current in a lateral direction in the configuration, in which a condenser lens is disposed.

On the other hand, as shown in FIG. 4, in the configuration, in which a condenser lens is disposed, the light is condensed on the vicinity of the center of the pixel in the photoelectric conversion layer 24 and, therefore, the diffusion current in the lateral direction is reduced.

Figure 5:
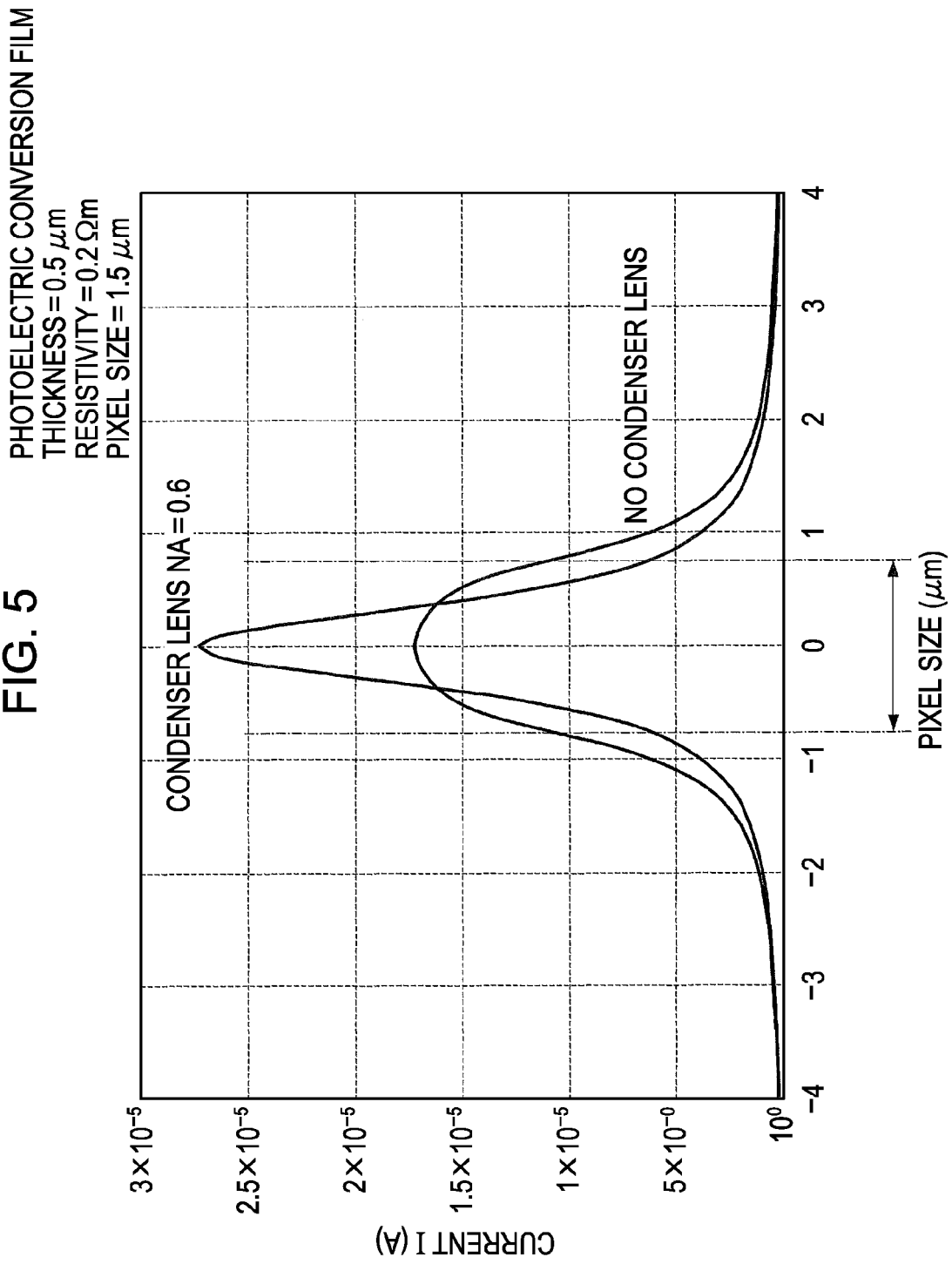
FIG. 5 is a diagram showing the results of simulation of a diffusion current in a lateral direction depending on presence or absence of a condenser lens.

FIG. 5 shows the results of simulation of this state.

As shown in FIG. 5, it is assumed here that the light is in the state of being applied continuously and photoelectrons are yielded uniformly in the photoelectric conversion layer 24 of one pixel. Then, estimation is conducted while the thickness of the photoelectric conversion layer 24 (conductive layer 22) is assumed to be 0.5 μm, the pixel size is assumed to be 1.5 μm, the resistivity of the photoelectric conversion layer 24 is assumed to be 0.2 Ωm, and the reading voltage is assumed to be 5 V. Regarding the current distribution, the distribution just above the first electrode 21 is estimated.

Moreover, the NA of the condenser lens 33 is assumed to be 0.6, and the state, in which photoelectric conversion occurs intensely at the center of the pixel (light condensation state), is determined from the formula of Bessel function of the Airy disc.

As is clear from these results, in the state, in which there is no condenser lens 33, the current spreads to the outside of the pixel, whereas the current is gathered in the vicinity of the center by using the condenser lens 33 and, consequently, leakage current to the outside of the pixel is reduced.

This refers to a reduction in color mixing and an improvement in color reproducibility. In particular, in the case of an organic conductive layer, it is not easy to etch the boundary region of the pixel by the technology, e.g., lithography, an RIE process, or the like. According to the method by using the condenser lens 33, a process for separating pixels from each other becomes unnecessary, and there is a cost advantage.

Explanation of Reading Circuit of Solid-State Imaging Device

Figure 6:
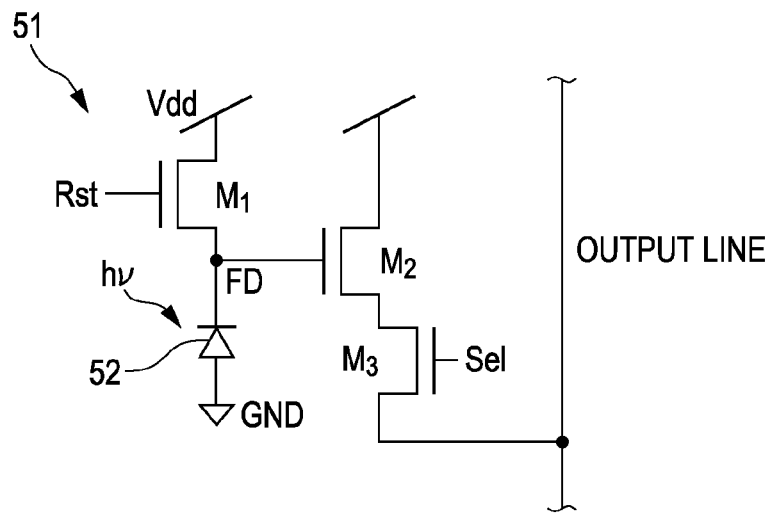
FIG. 6 is a circuit diagram showing an example of a reading circuit.

FIG. 6 shows a reading circuit 51 of a signal.

In the above-described reading circuit 51, a diffusion layer of a reset transistor M1 and a gate electrode of an amplifying transistor M2 are connected to a floating diffusion portion FD connected to a photoelectric conversion portion 52. Furthermore, a selection transistor M3 sharing a diffusion layer of the amplifying transistor M2 is connected. An output line is connected to a diffusion layer of this selection transistor M3. In this regard, the above-described photoelectric conversion portion 51 is formed from the above-described photoelectric conversion layer 24, the first electrode 21, the plug 16, the pixel electrode 13, the charge accumulation layer 12, and the like, as described above with reference to FIG. 1.

In this manner, the process is made easy by producing the individual transistors of the reading circuit 51, the charge accumulation layer 12, pixel electrode 13, and the like on the silicon substrate 11 (refer to FIG. 1 described above) in advance, and producing the above-described structure as a layer thereon.

Explanation of Band Diagram of Solid-State Imaging Device

FIG. 7 to FIG. 10 show band diagrams with respect to the above-described solid-state imaging device 1.

Figure 7:
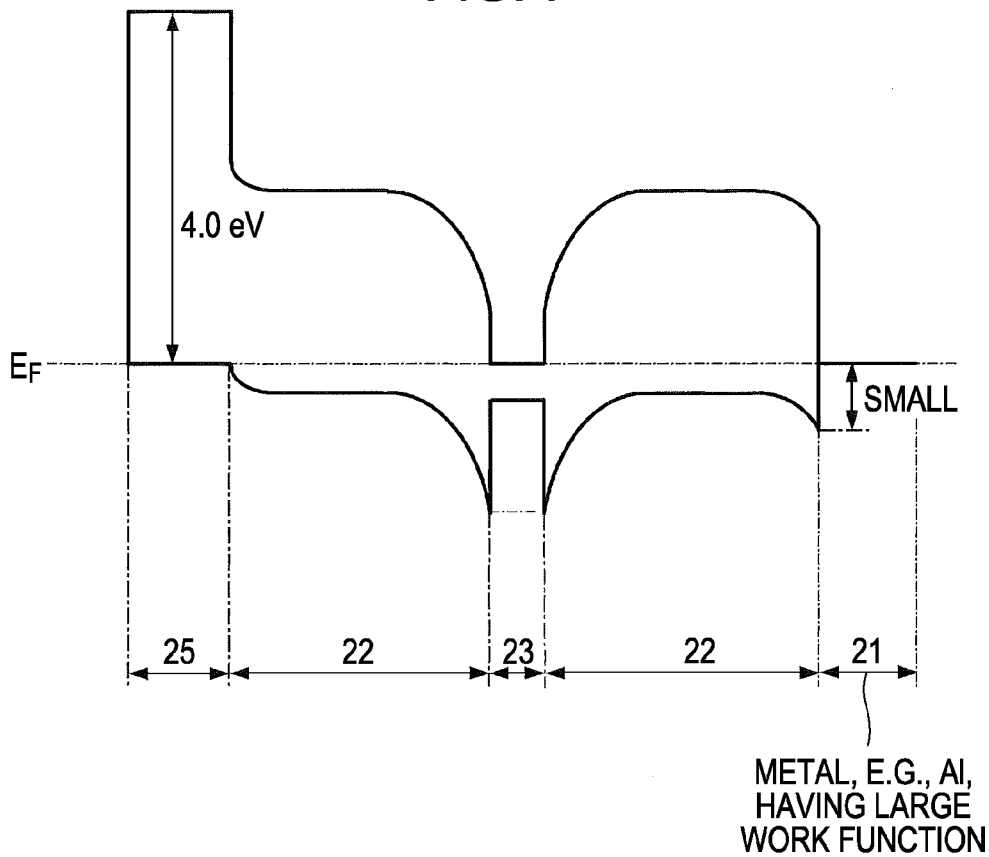
FIG. 7 is a band diagram at zero bias with respect to a solid-state imaging device 1.
Figure 8:
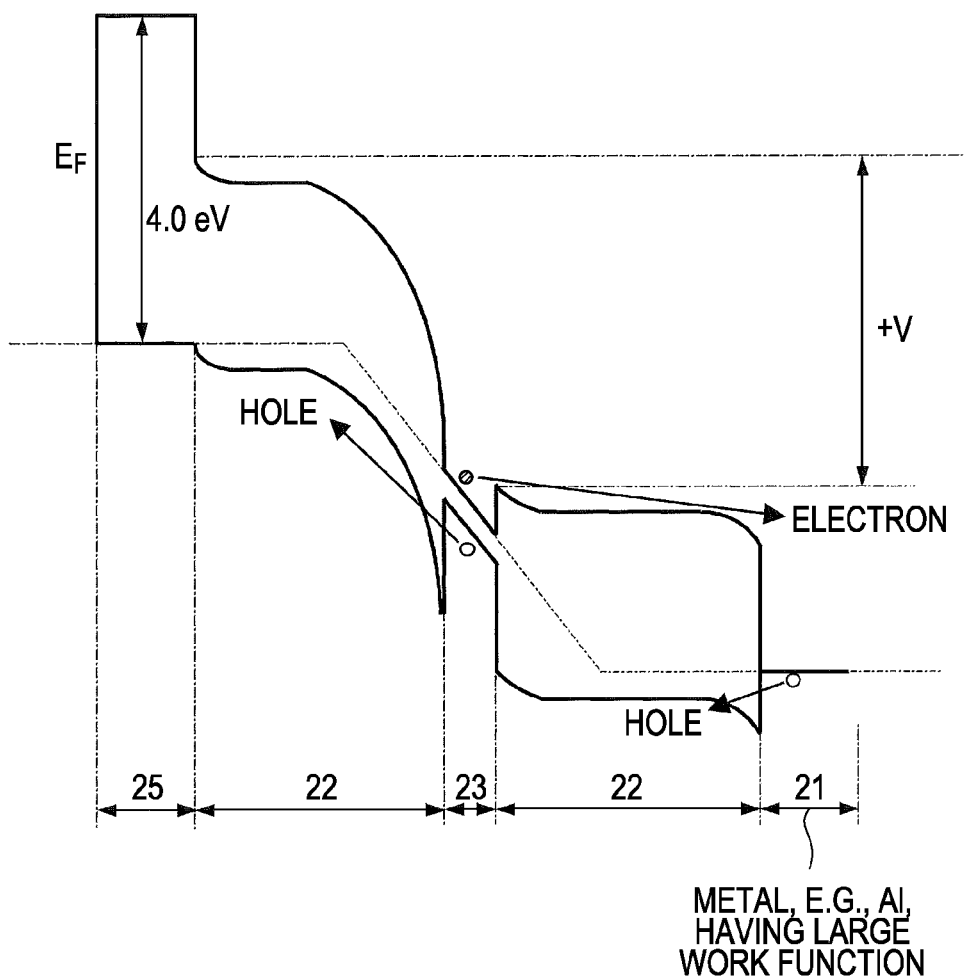
FIG. 8 is a band diagram at reverse bias with respect to the solid-state imaging device 1.
Figure 9:
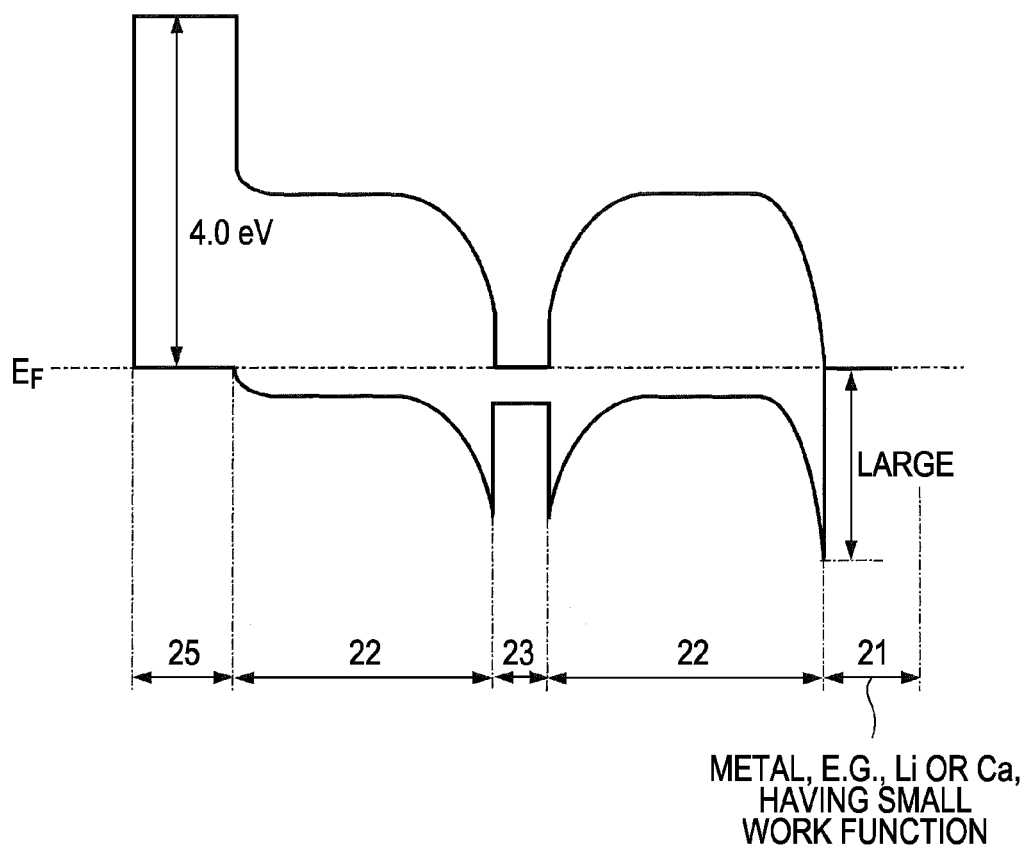
FIG. 9 is a band diagram at zero bias with respect to the solid-state imaging device 1.
Figure 10:
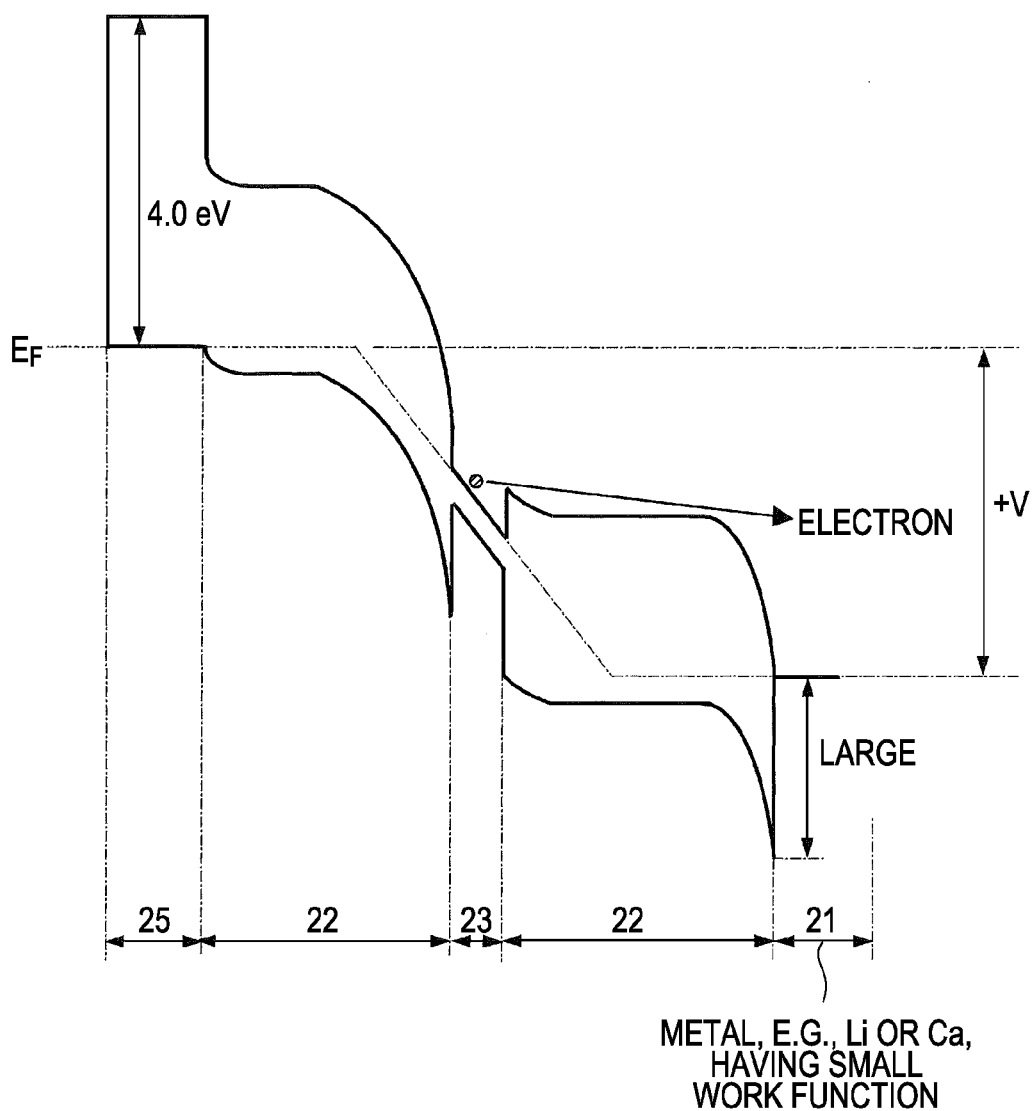
FIG. 10 is a band diagram at reverse bias with respect to the solid-state imaging device 1.

FIG. 7 and FIG. 9 show the case of zero bias, and FIG. 8 and FIG. 10 show the case where a reverse bias is applied.

In FIG. 7 and FIG. 8, the first electrode 21, which is a metal electrode, has a large work function, and the HOMO level (or the energy level of the valence band) of the conductive layer 22 is close to the Fermi level of the metal. For example, the case where poly2-methoxy-5-(2'-ethylhexyloxy)-1,4-phenylenevinylene (MEH-PPV) is used as the conductive layer 22 and aluminum (Al) is used as the first electrode 21, which is a metal electrode, corresponds to this.

In FIG. 9 and FIG. 10, the first electrode 21, which is a metal electrode, has a small work function, and the Fermi level of the metal is higher than the HOMO level (or the energy level of the valence band) of the conductive layer 22. For example, the case where MEH-PPV is used as the conductive layer 22 and lithium (Li) based material (for example, LiF) or calcium (Ca) is used as the first electrode 21, which is a metal electrode, corresponds to this.

As shown in FIG. 8 described above, an electron passes from the conductive layer 22 to the first electrode 21 side by application of a reverse bias voltage +V, but since the potential barrier of a hole present on the first electrode 21 side is small, the hole moves from the first electrode 21 to the conductive layer 22 due to a tunnel effect at the same time. As a result, a leakage current occurs.

On the other hand, as shown in FIG. 10, even when the reverse bias voltage +V is applied, a leakage current is small because the potential barrier of a hole present on the first electrode 21 side is large.

Therefore, it is desirable that the first electrode 21, which is a metal electrode, under (the side opposite to the light-incident side relative to the photoelectric conversion layer 24) the photoelectric conversion layer 24 is formed from a material having a work function smaller than that of the conductive layer 22.

In the case where the material is selected in consideration of the properties, as described above, it becomes possible to suppress a leakage current and read merely signal intensity efficiently, so that an image having a high S/N ratio can be obtained.

2. Second Embodiment

Second Example of Solid-State Imaging Device

A second example of the configuration of a solid-state imaging device according to a second embodiment of the present invention will be described below.

This solid-state imaging device 2 corresponds to the above-described solid-state imaging device 1, in which at least one type of an inorganic phosphor, a light-emitting colorant, and an organic phosphor serving as a light-emitting material is introduced dispersing into the photoelectric conversion layer 24 (conductive layer 22), so as to reduce photon shot noises.

Explanation of Photon Shot Noise

Initially, a photon shot noise will be described.

Since the photon is a Bose particle, overlapping of particles occurs, and in the continuous light, there are parts, in which photons are dense, and parts, in which photons are sparse (photon bunching effect). This causes an occurrence of temporal and spatial fluctuations in the number of incident photons. This is the origin of the photon shot noise.

This photon shot noise Nn follows the Poisson's distribution statistically and satisfies $$Nn=\sqrt{Ns}$$

where the number of incident photons per unit time is assumed to be Ns. At this time, the SN ratio becomes $$Ns/Nn=Ns/\sqrt{Ns}=\sqrt{Ns}.$$

Therefore, as the number of incident photons Ns decreases, the SN ratio decreases theoretically.

On the other hand, the photon shot noise of the solid-state imaging device (image sensor) is determined on the basis of the spatial fluctuation. If the amplitude of the temporal fluctuation of each pixel is reduced, the spatial fluctuation can be reduced at the same time.

Figure 11:
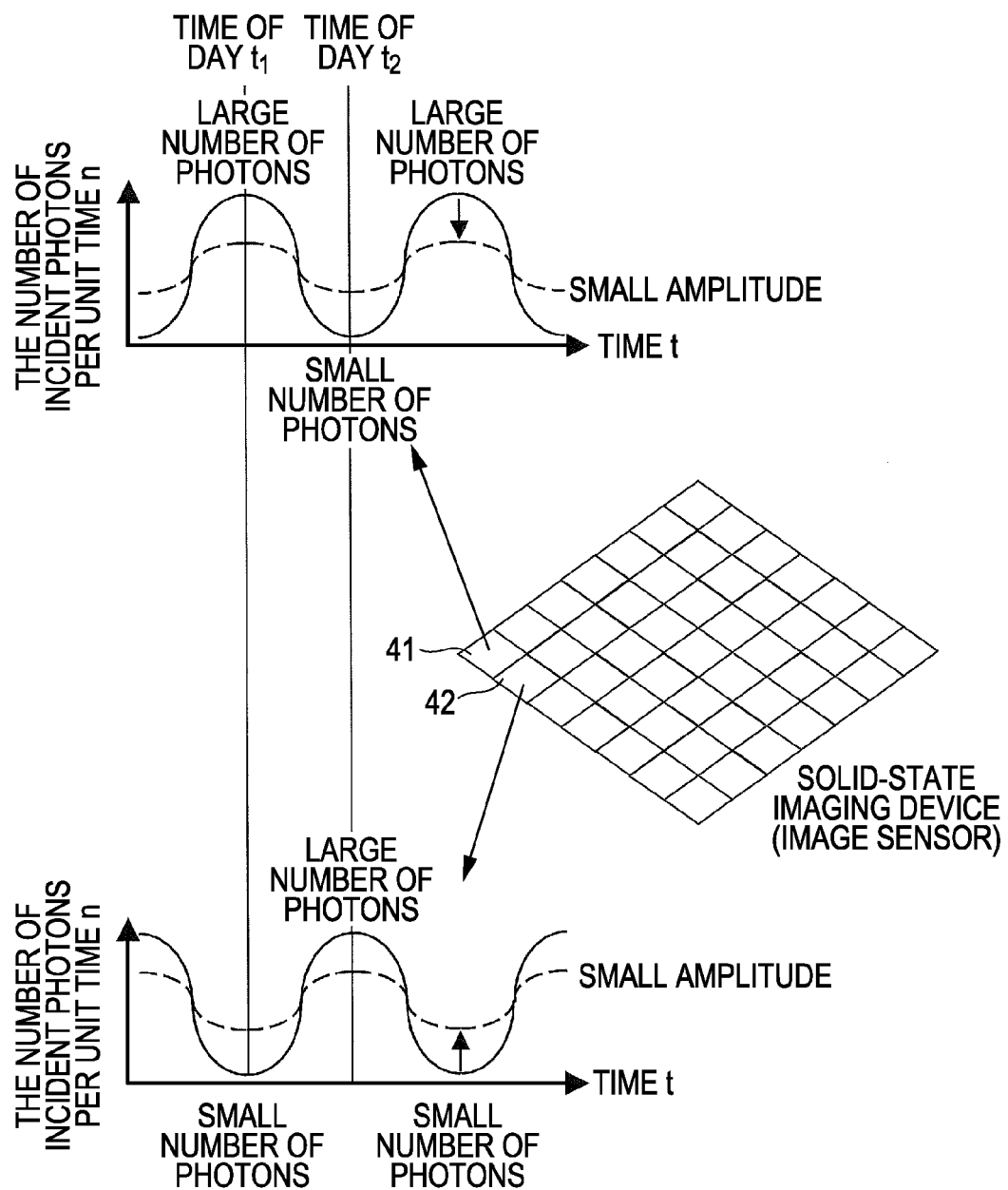
FIG. 11 is a diagram for explaining photon shot noises of a solid-state imaging device (image sensor)

That is, as shown in FIG. 11, there is a difference in the number of incident photons per unit time between a pixel 41 and a pixel 42 at each of the time $t_1$ of the day and the time $t_2$ of the day.

At the time $t_1$ of the day, (the number of incident photons per unit time of the pixel 41)>(the number of incident photons per unit time of the pixel 42)

holds. At the time $t_2$ of the day, (the number of incident photons per unit time of the pixel 42)>(the number of incident photons per unit time of the pixel 41)

holds. This refers to that light and shade in the image at the time $t_1$ of the day are reverse of those at the time $t_2$ of the day, and light and shade in the image of pixel 41 are reverse of those of the pixel 42.

Such a difference corresponds to a spatial fluctuation at each time of the day so as to become a sensor noise. Here, if it is provided that the amplitude of the spatial fluctuation is reduced as indicated by a broken line shown in the drawing, this difference is reduced, and the spatial fluctuation, that is, noises of the sensor are reduced.

Configuration of Second Example of Solid-State Imaging Device

The second example of the configuration of the solid-state imaging device according to the second embodiment of the present invention will be described with reference to a schematic configuration sectional view shown in FIG. 12.

Figure 12:
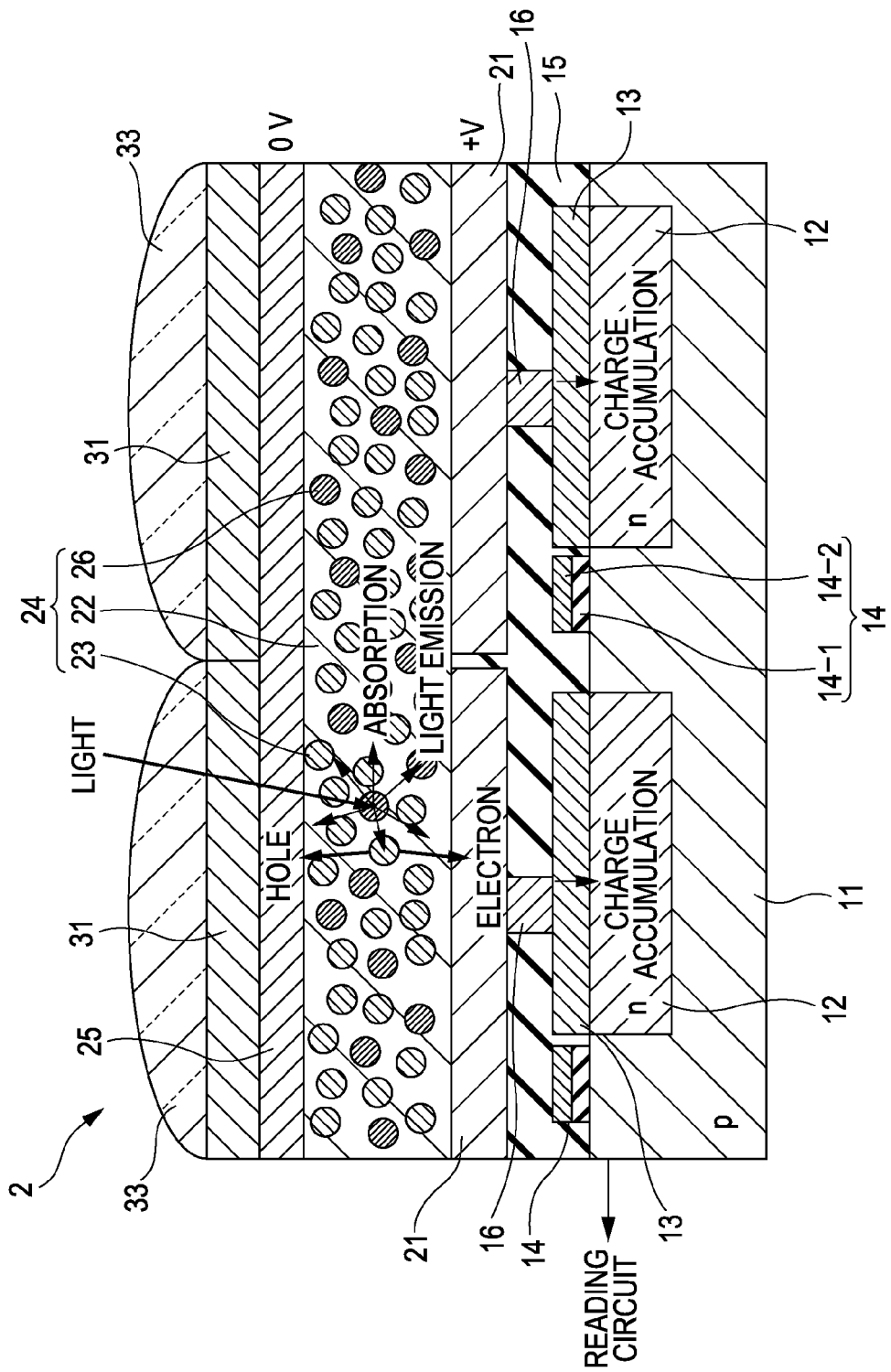
FIG. 12 is a schematic configuration sectional view showing a second example of a solid-state imaging device according to a second embodiment of the present invention.

As shown in FIG. 12, for example, a p-type silicon substrate is used as a silicon substrate 11. A plurality of pixels are disposed on the above-described silicon substrate 11. In the drawing, two pixels are shown as typical examples.

A charge accumulation layer 12 is disposed on the above-described silicon substrate 11 on a pixel basis. This charge accumulation layer 12 is formed from, for example, an n-type impurity diffusion layer. For example, the silicon substrate 11 is doped with an n-type impurity, e.g., phosphorus (P) or arsenic (As), so as to form the charge accumulation layer 12.

Pixel electrode 13 is disposed on the above-described charge accumulation layer 12. Furthermore, a gate MOS 14 to read a signal from the charge accumulation layer 12 to a reading circuit (not shown in the drawing) is disposed, on a pixel basis, on the above-described silicon substrate 11. In this gate MOS 14, a gate electrode 14-2 is disposed on the silicon substrate 11 with a gate insulating film 14-1 therebetween.

An insulating film 15 covering the above-described pixel electrodes 13, the gate MOSs 14, and the like is disposed on the above-described silicon substrate 11. This insulating film 15 is formed from, for example, a silicon oxide film. As a matter of course, the insulating film 15 may be formed from an inorganic insulating film or an organic insulating film other than the silicon oxide film.

Plugs 16 connected to the above-described pixel electrodes 13 are disposed in the above-described insulating film 15. This plug 16 is formed from, for example, tungsten. As a matter of course, electrically conductive materials other than tungsten can be used.

First electrodes 21 connected to the above-described plugs 16 are disposed on the above-described insulating film 15. These first electrodes 21 are disposed separately on a pixel basis. This electrode is formed from a transparent electrode material of, for example, indium tin oxide (ITO), indium zinc oxide, or zinc oxide. Alternatively, this electrode is formed from a metal electrode of lithium fluoride (LiF), calcium, or the like. That is, it is preferable that the metal electrode of the first electrode 21 has a work function smaller than the work function of a conductive layer 22 and the Fermi level of the metal electrode of the first electrode 21 is higher than the HOMO level (or the energy level of a valence band) of the conductive layer 22.

A photoelectric conversion layer 24 is disposed on the above-described first electrodes 21. In this photoelectric conversion layer 24, narrow gap semiconductor quantum dots 23 and light-emitting members 26 are dispersed in the conductive layer 22.

The above-described narrow gap semiconductor quantum dot 23 has a band gap of 1 eV or less and is formed in such a way that the particle diameter is, for example, 10 nm or less. Examples of materials therefor include a lead selenium compound (PbSe), a lead sulfur compound (PbS), a lead tellurium compound (PbTe), a cadmium selenium compound (CdSe), a cadmium tellurium compound (CdTe), an indium antimony compound (InSb), and an indium arsenic compound (InAs).

As for the above-described light-emitting member 26, at least one type of an inorganic phosphor, a light-emitting colorant, and an organic phosphor is used. For example, the above-described inorganic phosphor is composed of a manganese-doped fluoride inorganic phosphor.

Furthermore, as for the above-described conductive layer 22, MEH-PPV is used.

A second electrode 25 is disposed on the above-described photoelectric conversion layer 24. This second electrode 25 is an electrode on the light-incident side and, therefore, is formed from a transparent electrode of, for example, indium tin oxide (ITO), indium zinc oxide, or zinc oxide, which has a light-transmitting property.

Moreover, color filter layers 31 are disposed on the above-described second electrode 25. In this regard, a transparent insulating film (not shown in the drawing) may be disposed as a base material of the color filter layers 31.

In addition, a condenser lens 33 is disposed, on a pixel basis, on the above-described color filter layer 31.

The solid-state imaging device 2 has the above-described configuration.

In the above-described solid-state imaging device 2, in order to level the temporal fluctuation in the number of photons, the light-emitting members 26 are introduced in the photoelectric conversion layer 24.

Figure 13:
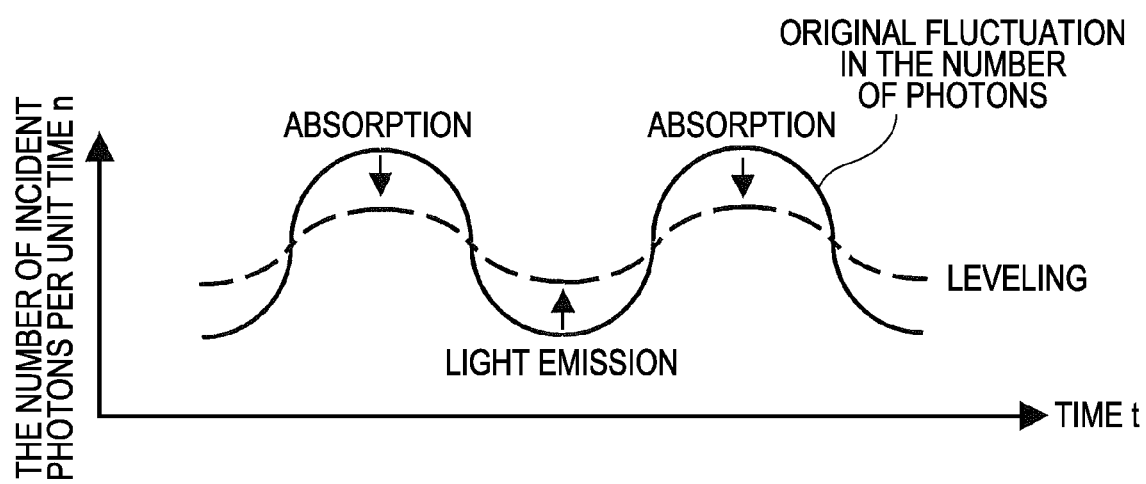
FIG. 13 is a diagram showing the relationship between the number of incident photons exhibiting temporal fluctuations in the number of photons and the time of a solid-state imaging device 2.

Consequently, as shown in FIG. 13, a function is performed in such a way that absorption increases when the number of photons increases and a decrease in the number of photons is compensated by light emission of the light-emitting members 26 when the number of photons decreases, and leveling indicated by broken line is conducted.

In the above-described solid-state imaging device 2, for example, the narrow gap semiconductor quantum dots 23 and the light-emitting members 26 are mixed and introduced. Consequently, the number of photons is leveled through light emission and absorption, the photons can undergo photoelectric conversion, so that a high quantum efficiency can be obtained.

A specific extent of improvement of the SN ratio was estimated with respect to a Green pixel having a pixel size of 1.1 μm. In this regard, the SN ratio here is defined as 20×log (Signal/Noise) in terms of dB.

As for the condition of the phosphor, in the case where light emission was conducted at an absorptance of 0.5 and a quantum efficiency of 0.3, the time constant of light emission was assumed to be 1/30 sec. In this case, the SN ratio became 36.3 dB from 32.9 dB and, therefore, was improved by 3.4 dB. Furthermore, in the case where light emission was conducted at an absorptance of 0.5 and a quantum efficiency of 0.5, the time constant of light emission was assumed to be 1/30 sec. In this case, the SN ratio became 38.6 dB from 32.9 dB and, therefore, was improved by 5.7 dB.

In addition, in the case where light emission was conducted at an absorptance of 0.6 and a quantum efficiency of 1.0, the time constant of light emission was assumed to be 1/30 sec. In this case, the SN ratio became 64.4 dB from 32.9 dB and, therefore, was improved by 31.5 dB.

The above-described estimation was premised on a Sin wave with a frequency of photon fluctuation of 15 Hz.

Furthermore, as for the other conditions, on the light source side, the color temperature was 3,200 K, and the brightness was 706 nit. On the imaging side, the image surface illuminance was 11.0 lx, the exposure time was 1/30 sec, and the F value was 5.6. Moreover, an infrared-cut filter and a color filter were disposed.

Figure 14:
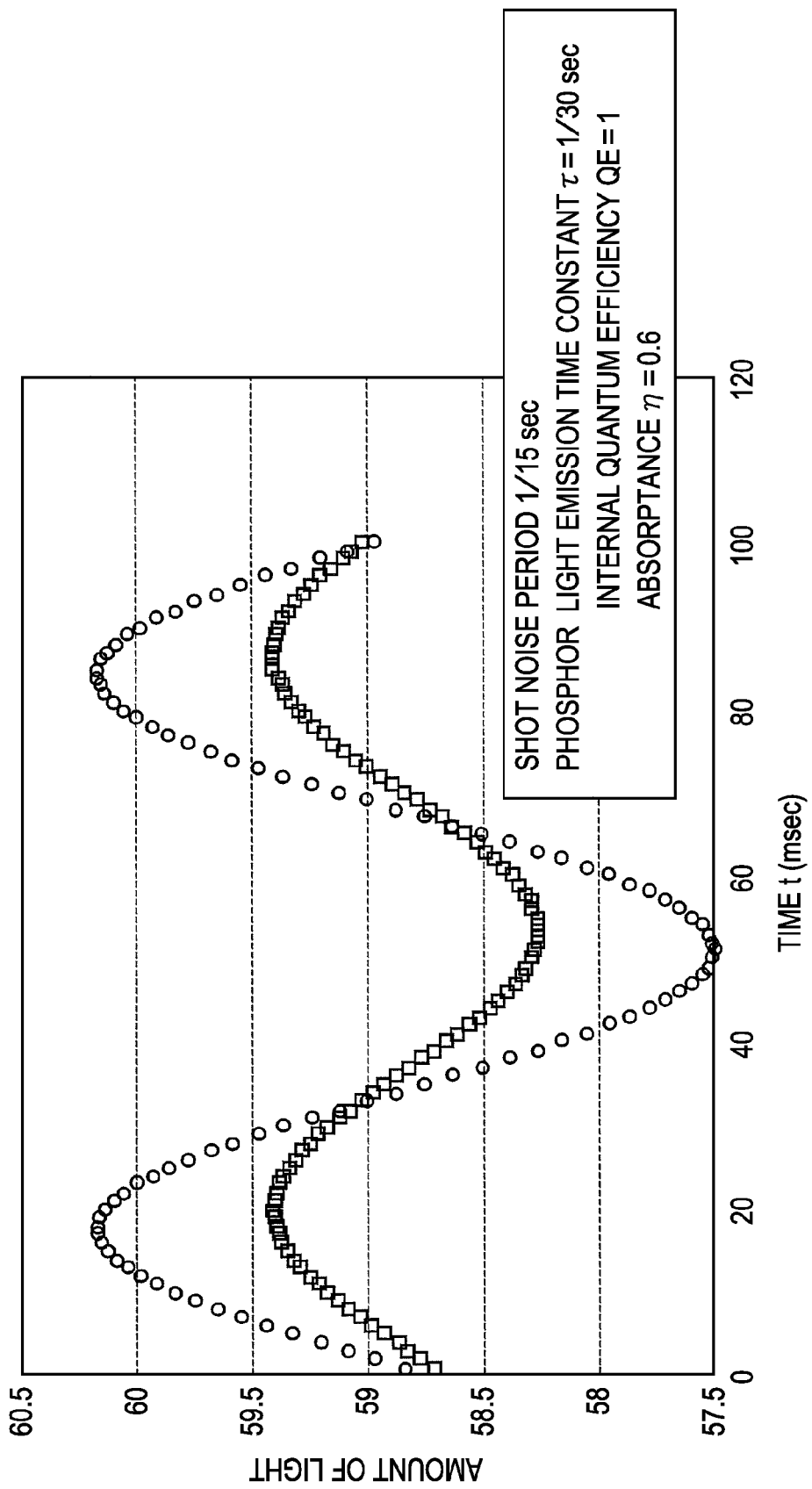
FIG. 14 is a diagram showing the relationship between the amount of photons and the time based on a simulation.

In this regard, as an example, FIG. 14 shows the results of simulation of changes over time in the case where the absorptance of the phosphor was 0.6, the quantum efficiency was 1.0, and the time constant of light emission was 1/30 sec. As is clear from FIG. 14, the amplitude of fluctuation is reduced.

Consequently, the above-described solid-state imaging device 2 includes the photoelectric conversion layer 24, in which narrow gap semiconductor quantum dots 23 are dispersed in the conductive layer 22 and, thereby, the avalanche multiplication can be effected by low voltage drive. Hence, there is an advantage that the sensitivity of even a fine pixel can be enhanced through multiplication. Furthermore, at least one type of an inorganic phosphor, a light-emitting colorant, and an organic phosphor is dispersed in the conductive layer 22, so that photon shot noises are reduced.

Modified Example 1 of Second Example of Solid-State Imaging Device

In the case where the light-emitting members 26 are contained in the photoelectric conversion layer 24 as in the above-described solid-state imaging device 2, an afterimage may occur. As a result, an image movement may occur in the case of a moving subject or hand shaking. The case where a phosphor is used as the light-emitting member 26 will be described below.

Figure 15:
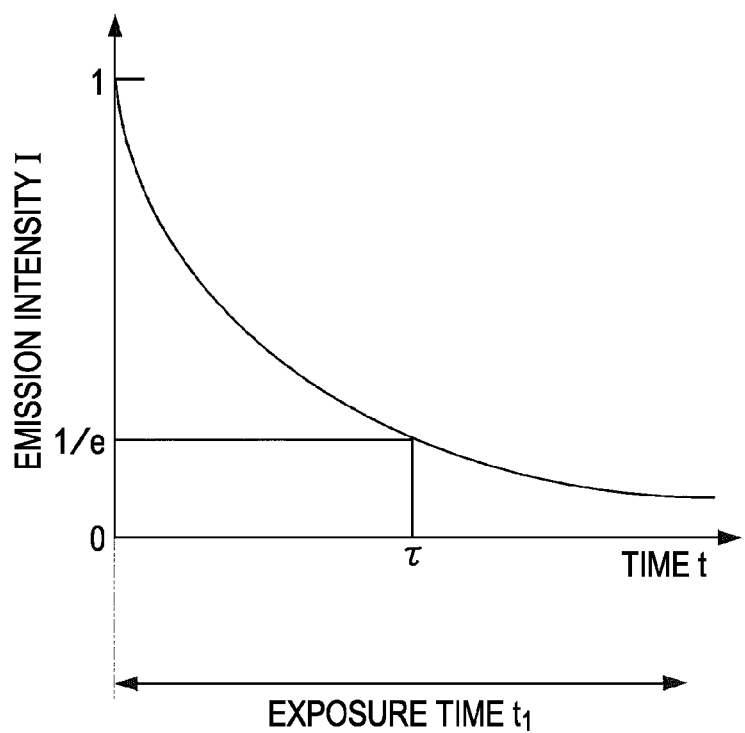
FIG. 15 is a diagram showing the relationship between the emission intensity and the time.

In this case, as shown in FIG. 15, this phenomenon can be reduced to an insignificant level desirably by setting the time constant τ of light emission of the phosphor within the exposure time $t_1$.

Here, the time constant τ of light emission refers to a time elapsed since excitation light, which is a short pulse wave, enters at the time 0 until the emission intensity I attenuates to 1/e, as shown in the drawing. Here, e represents the Napier's constant or the base of the natural logarithm.

It is desirable that the time constant τ of light emission of the phosphor is within the exposure time $t_1$. On the other hand, if the time constant is too short, the effect of reducing photon shot noises is reduced.

Therefore, it is optimum that the time constant of light emission is set at the maximum within an exposure time of a common camera of 1/15 sec to 1/60 sec.

For example, a manganese (Mn)-doped fluoride based phosphor has a large time constant of light emission, and some materials have time constants of light emission on the order of 10 msec. For example, it is clear that in the case where $Ca_5(PO_4)_3F:Mn$ is used as the phosphor, the time constant τ of light emission is 14 msec and is close to an optimum time.

Up to this point, the case where the phosphor is used as the light-emitting member 26 has been described mainly. However, light emitting materials can exert the same effects. For example, a light-emitting colorant or an organic phosphor may be introduced in the same manner.

As described above, the afterimage can be suppressed by specifying the individual time constants of light emission of the light-emitting members 26, e.g., the inorganic phosphor, the light-emitting colorant, and the organic phosphor, to be shorter than the exposure time of the above-described photoelectric conversion layer 24.

Modified Example 2 of Second Example of Solid-State Imaging Device

Figure 16:
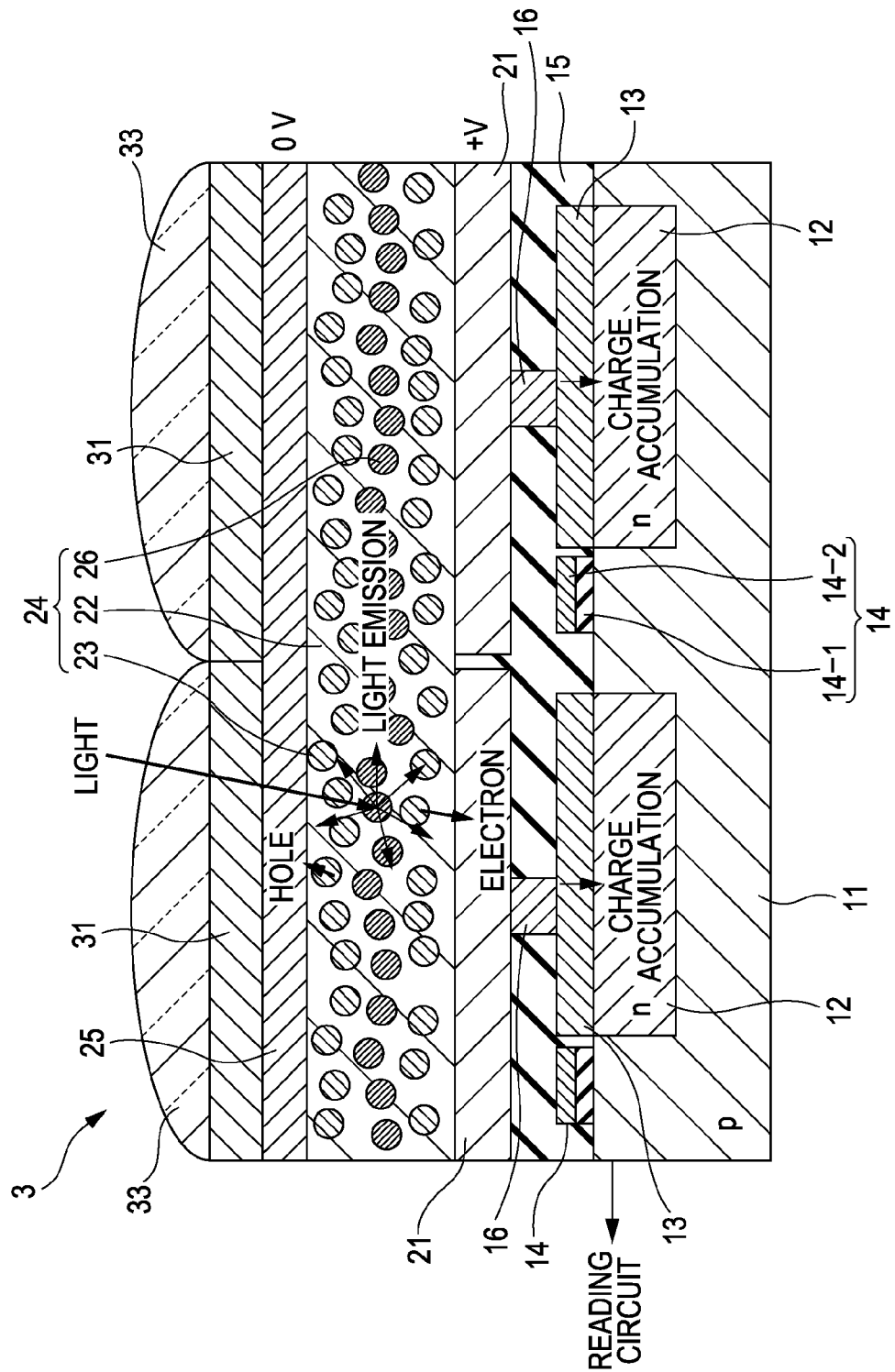
FIG. 16 is a schematic configuration sectional view showing a modified example 2 of the second example of the solid-state imaging device according to the second embodiment of the present invention.

Furthermore, as shown in FIG. 16, it is desirable that the above-described light-emitting members 26 in the solid-state imaging device 3 are dispersed in a manner described below. For example, the light-emitting members 26, which are composed of the above-described inorganic phosphor, the above-described light-emitting colorant, or the above-described organic phosphor, in an amount larger than the amount of the above-described narrow gap semiconductor quantum dots 23 is dispersed at the center of the above-described conductive layer 22 in the thickness direction. Moreover, the narrow gap semiconductor quantum dots 23 in an amount larger than the amount of the above-described light-emitting members 26 are dispersed on the above-described first electrode 21 side and the above-described second electrode 25 side of the above-described conductive layer 22.

The other configurations are the same as those of the solid-state imaging device 1 described with reference to FIG. 1 described above.

That is, for example, a p-type silicon substrate is used as a silicon substrate 11. A plurality of pixels are disposed on the above-described silicon substrate 11. In the drawing, two pixels are shown as typical examples.

A charge accumulation layer 12 is disposed on the above-described silicon substrate 11 on a pixel basis. This charge accumulation layer 12 is formed from, for example, an n-type impurity diffusion layer. For example, the silicon substrate 11 is doped with an n-type impurity, e.g., phosphorus (P) or arsenic (As), so as to form the charge accumulation layer 12.

Pixel electrode 13 is disposed on the above-described charge accumulation layer 12. Furthermore, a gate MOS 14 to read a signal from the charge accumulation layer 12 to a reading circuit (not shown in the drawing) is disposed, on a pixel basis, on the above-described silicon substrate 11. In this gate MOS 14, a gate electrode 14-2 is disposed on the silicon substrate 11 with a gate insulating film 14-1 therebetween.

An insulating film 15 covering the above-described pixel electrodes 13, the gate MOSs 14, and the like is disposed on the above-described silicon substrate 11. This insulating film 15 is formed from, for example, a silicon oxide film. As a matter of course, the insulating film 15 may be formed from an inorganic insulating film or an organic insulating film other than the silicon oxide film.

Plugs 16 connected to the above-described pixel electrodes 13 are disposed in the above-described insulating film 15. This plug 16 is formed from, for example, tungsten. As a matter of course, electrically conductive materials other than tungsten can be used.

First electrodes 21 connected to the above-described plugs 16 are disposed on the above-described insulating film 15. These first electrodes 21 are disposed separately on a pixel basis. This electrode is formed from a transparent electrode material of, for example, indium tin oxide (ITO), indium zinc oxide, or zinc oxide. Alternatively, this electrode is formed from a metal electrode of lithium fluoride (LiF), calcium, or the like. That is, it is preferable that the metal electrode of the first electrode 21 has a work function smaller than the work function of a conductive layer 22 and the Fermi level of the metal electrode of the first electrode 21 is higher than the HOMO level (or the energy level of a valence band) of the conductive layer 22.

A photoelectric conversion layer 24 having the above-described configuration is disposed on the above-described first electrodes 21. In this photoelectric conversion layer 24, narrow gap semiconductor quantum dots 23 and light-emitting members 26 are dispersed in the conductive layer 22. The configuration of dispersion is as described above.

The above-described narrow gap semiconductor quantum dot 23 has a band gap of 1 eV or less and is formed in such a way that the particle diameter is, for example, 10 nm or less. Examples of materials therefor include a lead selenium compound (PbSe), a lead sulfur compound (PbS), a lead tellurium compound (PbTe), a cadmium selenium compound (CdSe), a cadmium tellurium compound (CdTe), an indium antimony compound (InSb), and an indium arsenic compound (InAs).

As for the above-described light-emitting member 26, at least one type of an inorganic phosphor, a light-emitting colorant, and an organic phosphor is used. For example, the above-described inorganic phosphor is composed of a manganese-doped fluoride inorganic phosphor.

Furthermore, as for the above-described conductive layer 22, MEH-PPV is used.

A second electrode 25 is disposed on the above-described photoelectric conversion layer 24. This second electrode 25 is an electrode on the light-incident side and, therefore, is formed from a transparent electrode of, for example, indium tin oxide (ITO), indium zinc oxide, or zinc oxide, which has a light-transmitting property.

Moreover, color filter layers 31 are disposed on the above-described second electrode 25. In this regard, a transparent insulating film (not shown in the drawing) may be disposed as a base material of the color filter layers 31.

In addition, a condenser lens 33 is disposed, on a pixel basis, on the above-described color filter layer 31.

The solid-state imaging device 3 has the above-described configuration.

Regarding the solid-state imaging device 3, since the light-emitting members 26 have the above-described configuration, the light emitted from the light-emitting members 26 is absorbed by the narrow gap semiconductor quantum dots 23 efficiently and undergoes photoelectric conversion. Consequently, the avalanche multiplication is effected. Moreover, the same operation and effects as those of the above-described solid-state imaging device 1 are obtained.

Regarding the above-described solid-state imaging device 3, the light-emitting members 26 are introduced into the conductive layer 22 and, thereby, photon shot noises are reduced, while the photon shot noises occur significantly due to a decrease in the number of incident photons per unit time because of a size reduction of the pixel, a low illuminance condition, a high-speed imaging condition, or the like. Hence, it is possible that high S/N ratio image quality becomes compatible with high sensitivity through multiplication.

Furthermore, good image quality with a high S/N ratio can be provided even in the state, in which the number of photons incident on one pixel is small and the proportion of photon shot noises is large for the reason that the pixel size is small, high-speed imaging is conducted, imaging is conducted in a dark place, or the like.

3. Third Embodiment

First Example of Method for Manufacturing Solid-State Imaging Device

A first example of a method for manufacturing a solid-state imaging device according to a third embodiment of the present invention will be described below.

Figure 17:
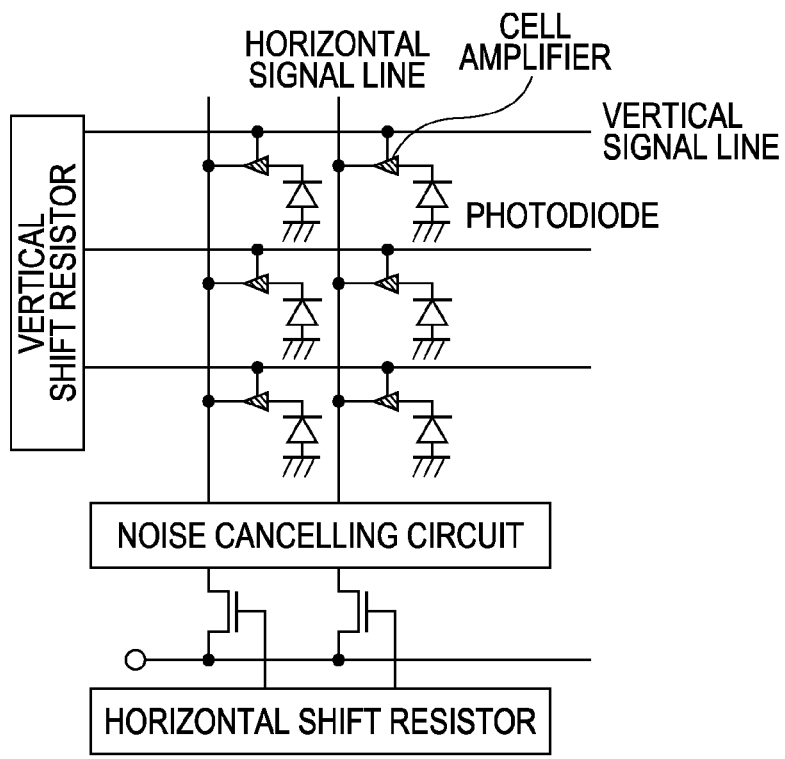
FIG. 17 is a circuit block diagram showing a CMOS image sensor, to which a solid-state imaging device is applied.
Figure 18:
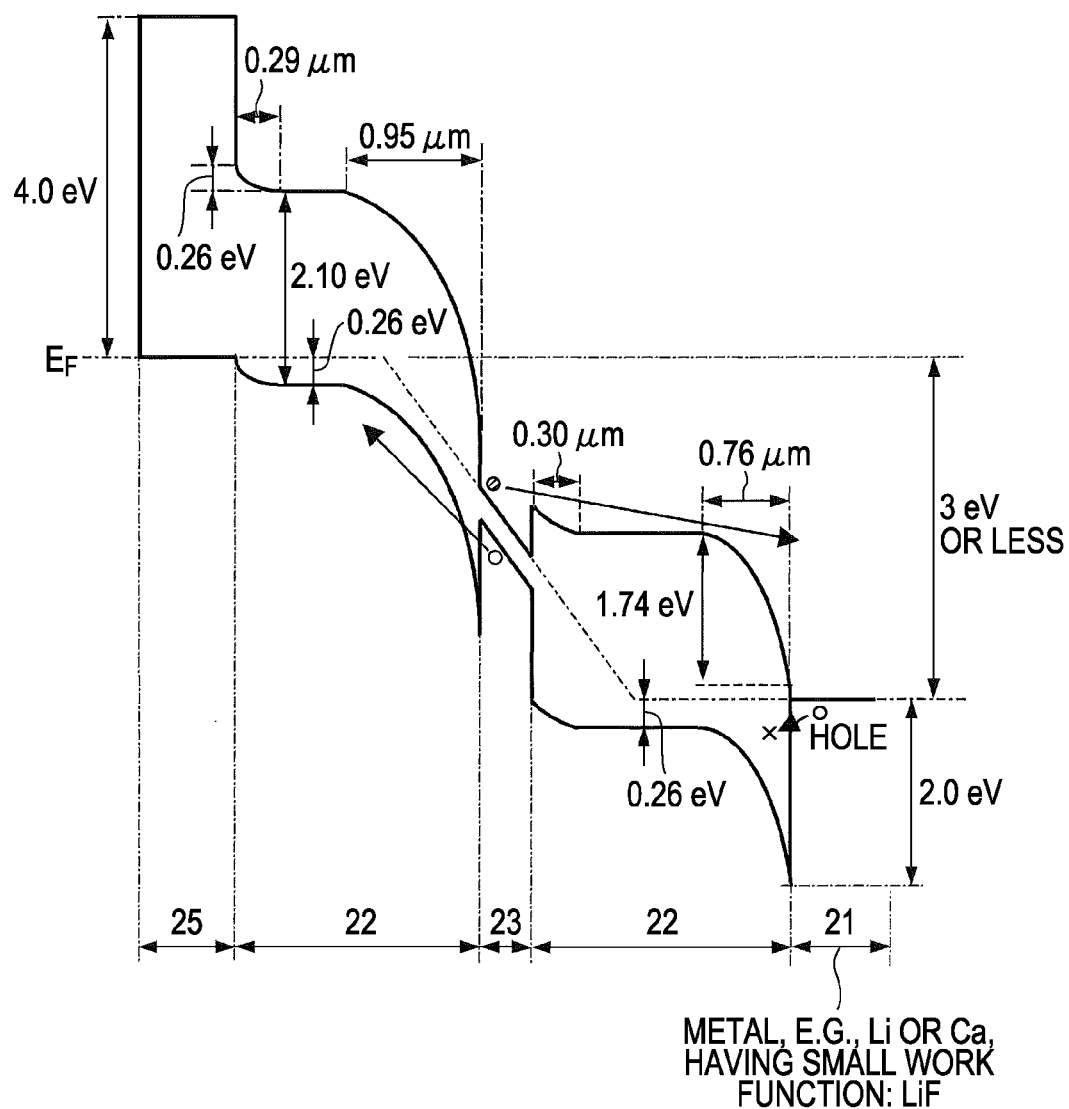
FIG. 18 is a band diagram with respect to the solid-state imaging device 1.

For example, the solid-state imaging device 1 shown in FIG. 1 described above can be applied to a photodiode of a CMOS image sensor shown in FIG. 17. In this regard, the band diagram of the above-described solid-state imaging device 1 is as shown in FIG. 18.

The above-described solid-state imaging device 1 can be formed on the silicon substrate 11 by common CMOS process steps, for example. The explanation will be made below with reference to FIG. 1 described above.

A p-type (100) silicon substrate is used as the above-described silicon substrate 11. Initially, the pixel transistors, the gate MOSs 14, in which a gate electrode 14-2 is disposed on the gate insulating film 14-1, used for reading, and circuits (not shown in the drawing) of transistors, electrodes, and the like of periphery circuits are formed on the above-described silicon substrate 11.

Thereafter, the charge accumulation layers 12 are disposed on the above-described silicon substrate 11. This charge accumulation layer 12 is formed from, for example, an n-type silicon layer through ion implantation. In this ion implantation, an ion implantation region is delimited by using a resist mask. This resist mask is removed after the ion implantation.

Subsequently, the pixel electrodes 13 are formed on the above-described charge accumulation layers 12.

For example, Al electrodes are formed on the above-described charge accumulation layers 12 through evaporation. This process is executed by a common Si-LSI process. As a matter of course, besides aluminum, it is also possible to form from a gold wiring material, a metal compound wiring material, or the like used for semiconductor apparatuses.

Then, the insulating film 15 covering the above-described pixel electrodes 13, the gate MOSs 14, and the like is formed on the above-described silicon substrate 11. This insulating film 15 is formed from, for example, a silicon oxide film.

Next, the plugs 16 connected to the above-described pixel electrodes 13 are formed in the above-described insulating film 15. This plug 16 is formed by forming a contact hole reaching the above-described pixel electrode 13 in the above-described insulating film 15 and, thereafter, embedding a conductor into the resulting contact hole.

Subsequently, the first electrodes 21 connected to the above-described plugs 16 are formed on the above-described insulating film 15.

For example, Al electrodes connected to the above-described plugs 16 are formed on the above-described insulating film 15 through evaporation. This process can be executed by the common Si-LSI process. In addition, lithium fluoride (LiF) is evaporated on the surfaces of the above-described Al electrodes, so as to suppress a leakage current due to holes.

Then, the photoelectric conversion layer 24 is formed on the above-described first electrodes 21 by forming the conductive layer 22, in which narrow gap semiconductor quantum dots 23 are dispersed.

For example, the above-described photoelectric conversion layer 24 is formed as described below. Initially, lead selenium compound (PbSe) quantum dots are dispersed in the electrically conductive polymer material, MEH-PPV, by a chemical synthesis method in advance. A film is made therefrom by a spin coating method, so as to form the above-described photoelectric conversion layer 24.

As for the above-described narrow gap semiconductor quantum dots 23, besides the lead selenium compound (PbSe), quantum dots of narrow gap semiconductors of a lead sulfur compound (PbS), a lead tellurium compound (PbTe), a cadmium selenium compound (CdSe), a cadmium tellurium compound (CdTe), an indium antimony compound (InSb), an indium arsenic compound (InAs), and the like can be used.

Next, the second electrode 25 is formed on the above-described photoelectric conversion layer 24.

For example, a film of indium tin oxide (ITO) is formed as a transparent electrode film all over the above-described photoelectric conversion layer 24. For example, a sputtering method is used for this film formation. Furthermore, a metal wiring connected to the above-described second electrode 25 is wired and grounded to prevent charging due to accumulation of holes.

Moreover, in order to effect smooth movement of holes to the second electrode 25 side, an intermediate layer (not shown in the drawing) of, for example, PEDOT/PPS may be formed between the second electrode 25, which is an ITO transparent electrode, and the photoelectric conversion layer 24 of MEH-PPV before the above-described second electrode 25 is formed. This film formation can be conducted through spin coating, as in the above description. The above-described PEDOT/PPS is an abbreviation of poly(2,3-dihydrothieno(3,4-b)-1,4-dioxin/poly(styrenesulfonate).

In addition, the color filters 31 are formed on the above-described second electrode 25 of the individual pixels. Furthermore, the condenser lens 33 serving as the uppermost layer of this device is formed, on a pixel basis, on the above-described color filter 31 to increase the light condensation efficiency and reduce color mixing.

The solid-state imaging device 1 is formed as described above.

In the above-described solid-state imaging device 1, a signal is read by applying a reverse bias to the above-described photoelectric conversion layer 24. FIG. 18 shows a band diagram in the case where, for example, a reverse bias is applied up to 3 V.

As shown in FIG. 18, the signal can be read from a voltage of about 3 V, and an adequate signal based on avalanche multiplication can be read by an application of a reverse bias up to 8 V. It becomes possible to drive at such a low voltage.

Second Example of Method for Manufacturing Solid-State Imaging Device

A second example of the method for manufacturing the solid-state imaging device according to the third embodiment of the present invention will be described below.

Figure 19:
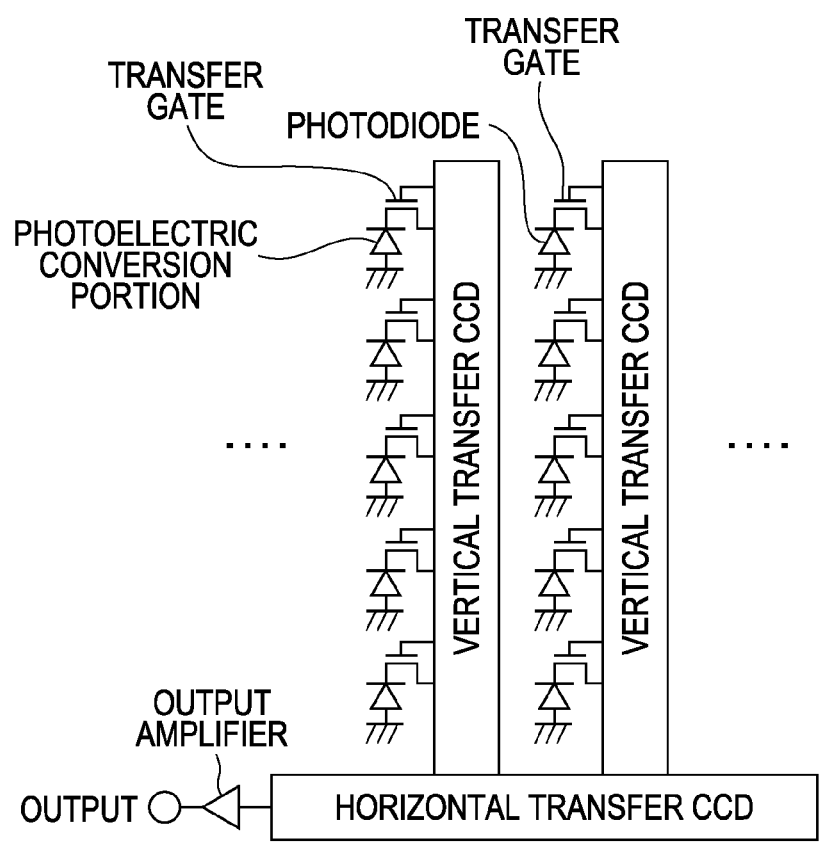
FIG. 19 is a circuit block diagram showing a CCD, to which a solid-state imaging device is applied.

For example, the solid-state imaging device 1 shown in FIG. 1 described above can be applied to a photodiode of a CCD image sensor shown in FIG. 19.

The above-described solid-state imaging device 1 can be formed on the silicon substrate 11 by common CCD process steps, for example. The explanation will be made below with reference to FIG. 1 described above.

A p-type (100) silicon substrate is used as the above-described silicon substrate 11. Initially, circuits of transfer gates (corresponding to the gate MOS 14), vertical transfer CCDs, and the like are formed on the above-described silicon substrate 11.

Thereafter, the charge accumulation layers 12 are disposed on the above-described silicon substrate 11. This charge accumulation layer 12 is formed from, for example, an n-type silicon layer through ion implantation. In this ion implantation, an ion implantation region is delimited by using a resist mask. This resist mask is removed after the ion implantation.

Subsequently, the pixel electrodes 13 are formed on the above-described charge accumulation layers 12.

For example, Al electrodes are formed on the above-described charge accumulation layers 12 through evaporation. This process is executed by a common Si-LSI process. As a matter of course, besides aluminum, it is also possible to form from a gold wiring material, a metal compound wiring material, or the like used for semiconductor apparatuses.

Then, the insulating film 15 covering the above-described pixel electrodes 13, the gate MOSs 14, and the like is formed on the above-described silicon substrate 11. This insulating film 15 is formed from, for example, a silicon oxide film.

Next, the plugs 16 connected to the above-described pixel electrodes 13 are formed in the above-described insulating film 15. This plug 16 is formed by forming a contact hole reaching the above-described pixel electrode 13 in the above-described insulating film 15 and, thereafter, embedding a conductor into the resulting contact hole.

Subsequently, the first electrodes 21 connected to the above-described plugs 16 are formed on the above-described insulating film 15.

For example, Al electrodes connected to the above-described plugs 16 are formed on the above-described insulating film 15 through evaporation. This process can be executed by the common Si-LSI process. In addition, lithium fluoride (LiF) is evaporated on the surfaces of the above-described Al electrodes, so as to suppress a leakage current due to holes.

Then, the photoelectric conversion layer 24 is formed on the above-described first electrodes 21 by forming the conductive layer 22, in which narrow gap semiconductor quantum dots 23 are dispersed.

For example, the above-described photoelectric conversion layer 24 is formed as described below. Initially, lead selenium compound (PbSe) quantum dots are dispersed into the electrically conductive polymer material, MEH-PPV, by a chemical synthesis method in advance. A film is made therefrom by a spin coating method, so as to form the above-described photoelectric conversion layer 24.

As for the above-described narrow gap semiconductor quantum dots 23, besides the lead selenium compound (PbSe), quantum dots of narrow gap semiconductors of a lead sulfur compound (PbS), a lead tellurium compound (PbTe), a cadmium selenium compound (CdSe), a cadmium tellurium compound (CdTe), an indium antimony compound (InSb), an indium arsenic compound (InAs), and the like can be used.

Next, the second electrode 25 is formed on the above-described photoelectric conversion layer 24.

For example, a film of indium tin oxide (ITO) is formed as a transparent electrode film all over the above-described photoelectric conversion layer 24. For example, a sputtering method is used for this film formation. Furthermore, a metal wiring connected to the above-described second electrode 25 is wired and grounded to prevent charging due to accumulation of holes.

Moreover, in order to effect smooth movement of holes to the second electrode 25 side, an intermediate layer (not shown in the drawing) of, for example, PEDOT/PPS may be formed between the second electrode 25, which is an ITO transparent electrode, and the photoelectric conversion layer 24 of MEH-PPV before the above-described second electrode 25 is formed. This film formation can be conducted through spin coating, as in the above description. The above-described PEDOT/PPS is an abbreviation of poly(2,3-dihydrothieno(3,4-b)-1,4-dioxin/poly(styrenesulfonate).

A photoelectric conversion portion is formed as described above.

In addition, the color filters 31 are formed on the above-described second electrode 25 of the individual pixels. Furthermore, the condenser lens 33 serving as the uppermost layer of this device is formed, on a pixel basis, on the above-described color filter layer 31 to increase the light condensation efficiency and reduce color mixing.

The solid-state imaging device 1 is formed as described above.

In the above-described solid-state imaging device 1, a signal is read by applying a reverse bias to the above-described photoelectric conversion layer 24. FIG. 18 described above shows a band diagram in the case where, for example, a reverse bias is applied up to 3 V.

As shown in FIG. 18 described above, the signal can be read from a voltage of about 3 V, and an adequate signal based on avalanche multiplication can be read by an application of a reverse bias up to 8 V. It becomes possible to drive at such a low voltage.

Third Example of Method for Manufacturing Solid-State Imaging Device

A third example of the method for manufacturing the solid-state imaging device according to the third embodiment of the present invention will be described below.

For example, the solid-state imaging device 2 shown in FIG. 12 described above can be applied to a photodiode of the CMOS image sensor shown in FIG. 17 described above. Furthermore, the band diagram of the above-described solid-state imaging device 2 is the same as that shown in FIG. 18 described above.

The above-described solid-state imaging device 2 can be formed on the silicon substrate 11 by common CMOS process steps, for example. The explanation will be made below with reference to FIG. 12 described above.

A p-type (100) silicon substrate is used as the above-described silicon substrate 11. Initially, the pixel transistors, the gate MOSs 14, in which a gate electrode 14-2 is disposed on the gate insulating film 14-1, used for reading, and circuits (not shown in the drawing) of transistors, electrodes, and the like of periphery circuits are formed on the above-described silicon substrate 11.

Thereafter, the charge accumulation layers 12 are disposed on the above-described silicon substrate 11. This charge accumulation layer 12 is formed from, for example, an n-type silicon layer through ion implantation. In this ion implantation, an ion implantation region is delimited by using a resist mask. This resist mask is removed after the ion implantation.

Subsequently, the pixel electrodes 13 are formed on the above-described charge accumulation layers 12.

For example, Al electrodes are formed on the above-described charge accumulation layers 12 through evaporation. This process is executed by a common Si-LSI process. As a matter of course, besides aluminum, it is also possible to form from a gold wiring material, a metal compound wiring material, or the like used for semiconductor apparatuses.

Then, the insulating film 15 covering the above-described pixel electrodes 13, the gate MOSs 14, and the like is formed on the above-described silicon substrate 11. This insulating film 15 is formed from, for example, a silicon oxide film.

Next, the plugs 16 connected to the above-described pixel electrodes 13 are formed in the above-described insulating film 15. This plug 16 is formed by forming a contact hole reaching the above-described pixel electrode 13 in the above-described insulating film 15 and, thereafter, embedding a conductor into the resulting contact hole.

Subsequently, the first electrodes 21 connected to the above-described plugs 16 are formed on the above-described insulating film 15.

For example, Al electrodes connected to the above-described plugs 16 are formed on the above-described insulating film 15 through evaporation. This process can be executed by the common Si-LSI process. In addition, lithium fluoride (LiF) is evaporated on the surfaces of the above-described Al electrodes, so as to suppress a leakage current due to holes.

Then, the photoelectric conversion layer 24 is formed on the above-described first electrodes 21 by forming the conductive layer 22, in which narrow gap semiconductor quantum dots 23 and the light-emitting members 26 are dispersed.

For example, the above-described photoelectric conversion layer 24 is formed as described below. Initially, lead selenium compound (PbSe) quantum dots and a phosphor, $Ca_5(PO_4)_3F:Mn$, are dispersed in the electrically conductive polymer material, MEH-PPV, by a chemical synthesis method in advance. A film is made therefrom by a spin coating method, so as to form the above-described photoelectric conversion layer 24. MEH-PPV is an abbreviation of poly2-methoxy-5-(2'-ethylhexyloxy)-1,4-phenylenevinylene.

As for the above-described narrow gap semiconductor quantum dots 23, besides the lead selenium compound (PbSe), quantum dots of narrow gap semiconductors of a lead sulfur compound (PbS), a lead tellurium compound (PbTe), a cadmium selenium compound (CdSe), a cadmium tellurium compound (CdTe), an indium antimony compound (InSb), an indium arsenic compound (InAs), and the like can be used.

As for the above-described light-emitting member 26, at least one type of an inorganic phosphor, a light-emitting colorant, and an organic phosphor is used. For example, a manganese-doped fluoride inorganic phosphor is used as the above-described inorganic phosphor.

Next, the second electrode 25 is formed on the above-described photoelectric conversion layer 24.

For example, a film of indium tin oxide (ITO) is formed as a transparent electrode film all over the above-described photoelectric conversion layer 24. For example, a sputtering method is used for this film formation. Furthermore, a metal wiring connected to the above-described second electrode 25 is wired and grounded to prevent charging due to accumulation of holes.

Moreover, in order to effect smooth movement of holes to the second electrode 25 side, an intermediate layer (not shown in the drawing) of, for example, PEDOT/PPS may be formed between the second electrode 25, which is an ITO transparent electrode, and the photoelectric conversion layer 24 of MEH-PPV before the above-described second electrode 25 is formed. This film formation can be conducted through spin coating, as in the above description. The above-described PEDOT/PPS is an abbreviation of poly(2,3-dihydrothieno(3,4-b)-1,4-dioxin/poly(styrenesulfonate).

In addition, the color filters 31 are formed on the above-described second electrode 25 of the individual pixels. Furthermore, the condenser lens 33 serving as the uppermost layer of this device is formed, on a pixel basis, on the above-described color filter layer 31 to increase the light condensation efficiency and reduce color mixing.

The solid-state imaging device 2 is formed as described above.

In the above-described solid-state imaging device 2, a signal is read by applying a reverse bias to the above-described photoelectric conversion layer 24. In this regard, a band diagram similar to that shown in FIG. 18 described above is exhibited.

Therefore, as shown in FIG. 18 described above, the signal can be read from a voltage of about 3 V, and an adequate signal based on avalanche multiplication can be read by an application of a reverse bias up to 8 V. It becomes possible to drive at such a low voltage. It was made clear that photon shock noises were suppressed and, as a result, the image quality of this solid-state imaging device 2 was high image quality with a high SN ratio and the sensitivity was high.

Fourth Example of Method for Manufacturing Solid-State Imaging Device

A fourth example of the method for manufacturing the solid-state imaging device according to the third embodiment of the present invention will be described below.

For example, the solid-state imaging device 3 shown in FIG. 16 described above can be applied to a photodiode of the CMOS image sensor shown in FIG. 17 described above.

The above-described solid-state imaging device 3 can be formed on the silicon substrate 11 by the common CMOS process steps, for example. The explanation will be made below with reference to FIG. 16 described above.

A p-type (100) silicon substrate is used as the above-described silicon substrate 11. Initially, the pixel transistors, the gate MOSs 14, in which a gate electrode 14-2 is disposed on the gate insulating film 14-1, used for reading, and circuits (not shown in the drawing) of transistors, electrodes, and the like of periphery circuits are formed on the above-described silicon substrate 11.

Thereafter, the charge accumulation layers 12 are disposed on the above-described silicon substrate 11. This charge accumulation layer 12 is formed from, for example, an n-type silicon layer through ion implantation. In this ion implantation, an ion implantation region is delimited by using a resist mask. This resist mask is removed after the ion implantation.

Subsequently, the pixel electrodes 13 are formed on the above-described charge accumulation layers 12.

For example, Al electrodes are formed on the above-described charge accumulation layers 12 through evaporation. This process is executed by a common Si-LSI process. As a matter of course, besides aluminum, it is also possible to form from a gold wiring material, a metal compound wiring material, or the like used for semiconductor apparatuses.

Then, the insulating film 15 covering the above-described pixel electrodes 13, the gate MOSs 14, and the like is formed on the above-described silicon substrate 11. This insulating film 15 is formed from, for example, a silicon oxide film.

Next, the plugs 16 connected to the above-described pixel electrodes 13 are formed in the above-described insulating film 15. This plug 16 is formed by forming a contact hole reaching the above-described pixel electrode 13 in the above-described insulating film 15 and, thereafter, embedding a conductor into the resulting contact hole.

Subsequently, the first electrodes 21 connected to the above-described plugs 16 are formed on the above-described insulating film 15.

For example, Al electrodes connected to the above-described plugs 16 are formed on the above-described insulating film 15 through evaporation. This process can be executed by the common Si-LSI process. In addition, lithium fluoride (LiF) is evaporated on the surfaces of the above-described Al electrodes, so as to suppress a leakage current due to holes.

Then, the photoelectric conversion layer 24 is formed on the above-described first electrodes 21 by forming the conductive layer 22, in which narrow gap semiconductor quantum dots 23 and the light-emitting members 26 are dispersed.

For example, the above-described photoelectric conversion layer 24 is formed as described below. Initially, lead selenium compound (PbSe) quantum dots are dispersed in the electrically conductive polymer material, MEH-PPV, by a chemical synthesis method in advance. A film is made therefrom by a spin coating method. Thereafter, the light-emitting members 26, for example, $Ca_5(PO_4)_3F:Mn$, which is a phosphor, are dispersed in the electrically conductive polymer material, MEH-PPV, and a film is made therefrom on the film containing PbSe. Furthermore, lead selenium compound (PbSe) quantum dots are dispersed in the electrically conductive polymer material, MEH-PPV, by a chemical synthesis method in advance, and a film is made therefrom by a spin coating method on the above-described film containing the phosphor.

In this manner, films are made three times through spin coating and, thereby, the photoelectric conversion layer 24 is formed having a three-layer structure, in which a high proportion of light-emitting member 26 is distributed in the vicinity of the center of the conductive layer 22 in the thickness direction and on and under thereof, a high proportion of narrow gap semiconductor quantum dots 23 is distributed.

As for the above-described narrow gap semiconductor quantum dots 23, besides the lead selenium compound (PbSe), quantum dots of narrow gap semiconductors of a lead sulfur compound (PbS), a lead tellurium compound (PbTe), a cadmium selenium compound (CdSe), a cadmium tellurium compound (CdTe), an indium antimony compound (InSb), an indium arsenic compound (InAs), and the like can be used.

Next, the second electrode 25 is formed on the above-described photoelectric conversion layer 24.

For example, a film of indium tin oxide (ITO) is formed as a transparent electrode film all over the above-described photoelectric conversion layer 24. For example, a sputtering method is used for this film formation. Furthermore, a metal wiring connected to the above-described second electrode 25 is wired and grounded to prevent charging due to accumulation of holes.

Moreover, in order to effect smooth movement of holes to the second electrode 25 side, an intermediate layer (not shown in the drawing) of, for example, PEDOT/PPS may be formed between the second electrode 25, which is an ITO transparent electrode, and the photoelectric conversion layer 24 of MEH-PPV before the above-described second electrode 25 is formed. This film formation can be conducted through spin coating, as in the above description. The above-described PEDOT/PPS is an abbreviation of poly(2,3-dihydrothieno(3,4-b)-1,4-dioxin/poly(styrenesulfonate).

In addition, the color filters 31 are formed on the above-described second electrode 25 of the individual pixels. Furthermore, the condenser lens 33 serving as the uppermost layer of this device is formed, on a pixel basis, on the above-described color filter layer 31 to increase the light condensation efficiency and reduce color mixing.

The solid-state imaging device 3 is formed as described above.

In the above-described solid-state imaging device 3, a signal is read by applying a reverse bias to the above-described photoelectric conversion layer 24. In this regard, a band diagram similar to that shown in FIG. 18 described above is exhibited.

Therefore, as shown in FIG. 18 described above, the signal can be read from a voltage of about 3 V, and an adequate signal based on avalanche multiplication can be read by an application of a reverse bias up to 8 V. It becomes possible to drive at such a low voltage. It was made clear that photon shock noises were suppressed and, as a result, the image quality of this solid-state imaging device 3 was high image quality with a high SN ratio and the sensitivity was high.

As for the above-described conductive layer 22, poly2-methoxy-5-(2'-ethylhexyloxy)-1,4-phenylenevinylene (MEH-PPV) has been described.

Examples of the above-described conductive layers 22, which exert the same effects, include electrically conductive inorganic materials, e.g., tin-antimony based oxide aqueous paints (produced by JEMCO, for example) and an aqueous dispersion of electrically conductive zinc oxide (produced by HAKUSUI TEC, for example). In addition to them, electrically conductive organic materials, e.g., polythiophene based organic electrically conductive polymer, are mentioned.

The photoelectric conversion layer 24 can be formed by dispersing the above-described narrow gap semiconductor quantum dots 23 into the above-described electrically conductive organic material or electrically conductive inorganic material and, thereafter, applying the resulting solution. As for the application of the above-described solution, not only the above-described spin coating method, but also coating methods, e.g., bar coating and dipping, and printing methods, e.g., screen printing and ink jet, can be used.

An example of the above-described dipping method will be described with reference to a schematic configuration diagram shown in FIG. 20.

Figure 20:
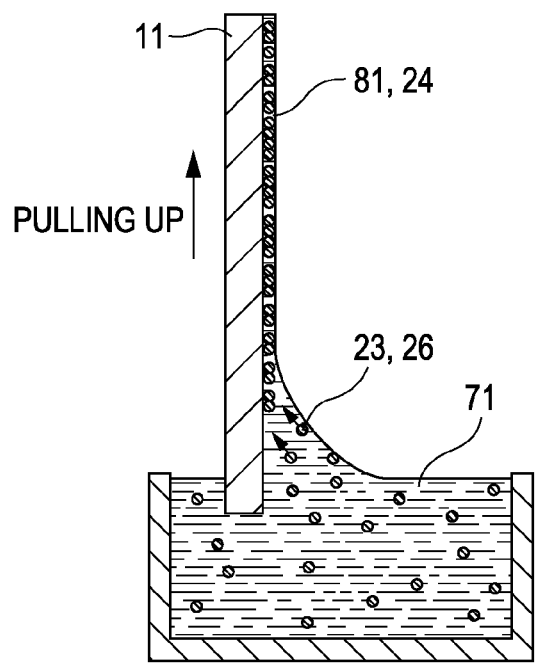
FIG. 20 is a schematic configuration diagram showing an example of a dipping method for forming a photoelectric conversion layer.

As shown in FIG. 20, the silicon substrate 11, in which steps up to the first electrodes 21 (not shown in the drawing) have been completed in advance, is dipped into the above-described solution 71 and the silicon substrate 11 is pulled upward, so that the solution is applied to the surface of the silicon substrate 11. At this time, the thickness of the coating film 81 (photoelectric conversion layer 24) can be controlled by adjusting the wettability of the surface through a nitrogen or oxygen plasma treatment or a hydrophilic chemical treatment of the surface of the silicon substrate 11 in advance or adjusting a pulling up speed of the silicon substrate 11. In general, the absorption coefficient of the narrow gap semiconductor is about two orders of magnitude higher than the absorption coefficient of silicon and, therefore, if the thickness of this photoelectric conversion layer 24 is 50 nm or more, a light absorption effect is exerted. Further desirably, in the case where the thickness is 500 nm or more, and 1 μm or less, an adequate light absorption effect is exerted.

Alternatively, as is explained with reference to FIG. 16 described above, the photoelectric conversion layer 24 may be formed while the conductive layer 22 containing the narrow gap semiconductor quantum dots 23 and the conductive layer 22 containing the light-emitting members 26 are separated. Moreover, a plurality of coating steps may be conducted repeatedly in the formation of the individual films, so as to have desired thicknesses.

Next, the proportions (percent by weight or volume ratio) of the narrow gap semiconductor quantum dots 23 and the light-emitting members 26 in the conductive layer 22 and the types of the light-emitting members 26 will be described.

The proportion of the narrow gap semiconductor quantum dots 23 in the conductive layer 22 of MEH-PPV is the same as the efficiency of a solar cell described in APPLIED PHYSICS LETTERS 86, 093103 (2005). Therefore, if MEH-PPV is specified to be 500 or more in terms of percent by weight, a multiplication effect is exerted. Further desirably, the proportion is specified to be 97±2% to obtain a maximum efficiency. The same holds for the other types of conductive layers.

In the case where the proportion of the light-emitting members 26 in the conductive layer 22 of MEH-PPV is 10 or more in terms of volume ratio in the whole photoelectric conversion layer 24, the effect is exerted. Furthermore, 100 or more is desirable to exert adequate effects of absorption and light emission of the light-emitting members 26.

Here, it is desirable that the size of the light-emitting member 26 is smaller than or equal to the thickness of the photoelectric conversion layer 24, that is, 1 μm or less. Moreover, nanosize particles of 50 nm or less are desirable to improve the dispersion characteristic in the conductive layer 22.

Examples of materials for the light-emitting member 26 include the following materials besides manganese-doped fluoride based inorganic phosphors.

For example, a phosphor, in which a ZnS base material is doped with a light emission center, e.g., Ag, Al, or Cu, and a phosphor, in which a $Y_2O_2S$ base material is doped with a light emission center, e.g., Eu, are included. Furthermore, a phosphor, in which a $(SrCaBaMg)_5(PO_4)_3Cl$ base material, a $(Y,Gd)BO_3$ base material, or a $BaMgAl_{10}O_{17}$ base material is doped with a light emission center, e.g., Eu, is included.

Moreover, a phosphor, in which a $LaPO_4$ base material is doped with a light emission center, e.g., Ce or Tb, is included.

In addition, a phosphor, in which a $Ca_{10}(PO_4)_6FCl$ base material is doped with a light emission center, e.g., Sb or Mn, is included.

Furthermore, a phosphor, in which a $Zn_2SiO_4$ base material is doped with a light emission center, e.g., Mn, is included.

Moreover, a phosphor, in which a $Sr_4Al_{14}O_{25}$ base material is doped with a light emission center, e.g., Eu or Dy, is included.

Next, a method for manufacturing the fine particles or the nanoparticles of the narrow gap semiconductor quantum dots 23 and the light-emitting members 26 will be described below.

In the above description, the chemical synthesis method is described. However, other methods can be employed. For example, a plurality of or a single compound raw material or a single element raw material is vaporized in a vacuum or in an inert gas, e.g., Ar, by a method of resistance heating, electron beam irradiation heating, or the like and is deposited on the substrate, so that fine particles are formed. As a matter of course, the above-described plurality of or the single compound raw material or the single element raw material contains an element constituting the above-described narrow gap semiconductor quantum dot 23 or the above-described light-emitting member 26. These fine particles are gathered and used for raw materials of the narrow gap semiconductor quantum dot 23 and the light-emitting member 26.

Alternatively, a target of a material for the narrow gap semiconductor quantum dot 23 or the light-emitting member 26 is sublimated through laser abrasion or the like and is deposited on the substrate in the same manner to form fine particles, followed by gathering.

In this regard, gathering is not necessarily conducted. The nanoparticles or the fine particles of the narrow gap semiconductor quantum dot 23 and the light-emitting member 26 may be formed through direct evaporation on the conductive layer 22.

Furthermore, a conductive layer 22 is formed thereon again to make a sandwich structure. In this case, the narrow gap semiconductor quantum dots 23 and the light-emitting members 26 are not necessarily dispersed in advance in the electrically conductive material for forming the conductive layer 22.

Alternatively, the nanoparticles or fine particles may be produced through pulverization. In this case, lumps of the raw material prepared in advance are worked into a desired size through pulverization with a ball mill, a beads mill, or the like.

4. Fourth Embodiment

One Example of Configuration of Imaging Apparatus

Next, an imaging apparatus according to an embodiment of the present invention will be described with reference to a block diagram shown in FIG. 21. This imaging apparatus includes the solid-state imaging device according to an embodiment of the present invention.

Figure 21:
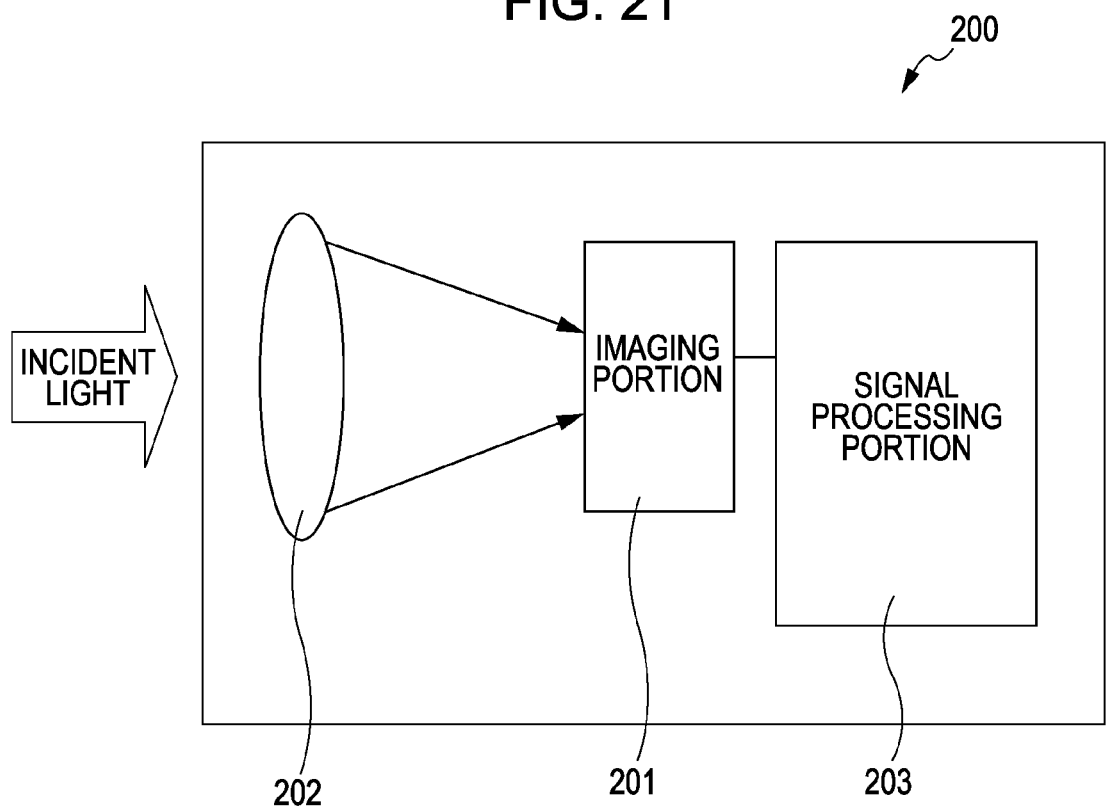
FIG. 21 is a block diagram showing an imaging apparatus according to an embodiment of the present invention.

As shown in FIG. 21, an imaging apparatus 200 includes a solid-state imaging device (not shown in the drawing) in an imaging portion 201. An image-forming optical portion 202 to form an image is provided on the light-condensing side of this imaging portion 201. Furthermore, the imaging portion 201 is connected to a signal processing portion 203 including a drive circuit to drive the imaging portion 201, a signal processing circuit to process the signal, which is photoelectrically converted with the solid-state imaging device, into an image, and the like. Moreover, the image signal processed with the above-described signal processing portion 203 can be stored in an image storage portion (not shown in the drawing). In such an imaging apparatus 200, as for the above-described solid-state imaging device of the above-described imaging portion 201, the solid-state imaging devices 1 to 3 described in the above-described embodiment can be used.

Regarding the imaging apparatus 200 according to an embodiment of the present invention, since the solid-state imaging devices 1 to 3 according to embodiments of the present invention are included, the sensitivity is enhanced and high-sensitivity imaging can be conducted. Consequently, deterioration of the image quality is suppressed, and imaging can be conducted with high sensitivity. Therefore, there is an advantage that photographing can be conducted with high image quality even in a dark photographing environment, for example, in night photographing, or the like.

Incidentally, the imaging apparatus 200 according to an embodiment of the present invention is not limited to the above-described configuration and can be applied to any imaging apparatus having a configuration including the solid-state imaging device.

The above-described solid-state imaging devices 1 to 3 may be in the form of one chip or in the form of a module, in which an imaging portion and a signal processing portion or an optical system are packaged collectively and which has an imaging function. Here, the imaging apparatus refers to, for example, cameras and portable apparatuses having an imaging function. Furthermore, a term "imaging" is interpreted in a broad sense and includes not only capture of an image in usual picture taking with a camera, but also detection of fingerprints and the like.

The present application contains subject matter related to that disclosed in Japanese Priority Patent Application JP 2009-017470 filed in the Japan Patent Office on Jan. 29, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a substrate with a plurality of pixels;
   a plurality of charge accumulation regions in the substrate respectively corresponding to the pixels;
   for each pixel, a pixel electrode on the substrate and over the respective charge accumulation region, the pixel electrode electrically coupled to the respective charge accumulation region;
   for each pixel, a first electrode carried on the substrate and electrically connected to the respective pixel electrode, the first electrodes positioned in a common layer;
   a second electrode disposed opposed to the first electrodes;
   a photoelectric conversion layer common to all of the pixels, which is disposed between the first electrodes and the second electrode and in which narrow gap semiconductor quantum dots are dispersed in a conductive layer, the photoelectric conversion layer effective to convert incident light into electrical charges suitable for generating an image signal; and
   for each pixel, a color filter over the respective charge accumulation region,
   wherein,
      each pixel is comprised of a respective first electrode, a portion of the photoelectric conversion layer, and the second electrode,
      charges generated by the photoelectric conversion layer based on light filtered by the color filters can be stored in the respective charge accumulation regions,
      the first electrodes are transparent electrodes and the second electrode is a transparent electrode or is a metal electrode, or the second electrode is a transparent electrode and the first electrodes are transparent electrodes or metal electrodes,
      an inorganic phosphor, a light-emitting colorant, or an organic phosphor is dispersed in the conductive layer,
      the inorganic phosphor, the light-emitting colorant, or the organic phosphor in an amount larger than the amount of the narrow gap semiconductor quantum dots is dispersed at the center of the conductive layer in the thickness direction, and
      the narrow gap semiconductor quantum dots in an amount larger than the amount of the inorganic phosphor, the light-emitting colorant, or the organic phosphor are dispersed on the first electrode side and the second electrode side of the conductive layer.

2. The solid-state imaging device according to claim 1, wherein the narrow gap semiconductor quantum dots have a band gap of 1 eV or less.

3. The solid-state imaging device according to claim 1, wherein the narrow gap semiconductor quantum dots are selected from a lead selenium compound, a lead sulfur compound, a lead tellurium compound, a cadmium selenium compound, a cadmium tellurium compound, an indium antimony compound, and an indium arsenic compound.

4. The solid-state imaging device according to claim 1, wherein the conductive layer comprises poly2-methoxy-5-(2'-ethylhexyloxy)-1,4-phenylenevinylene.

5. The solid-state imaging device according to claim 1, wherein:
   the first electrodes are metal electrodes, the metal electrodes have a work function smaller than the work function of the conductive layer, and the Fermi level of the metal electrodes is higher than the HOMO level of the conductive layer or the energy level of the valence band.

6. The solid-state imaging device according to claim 5, wherein:

the metal electrodes are made of lithium fluoride or calcium, and the transparent electrode is made of indium tin oxide.

7. The solid-state imaging device according to claim 1, wherein each pixel has a condenser lens that is disposed on the light-incident side of the pixel.

8. The solid-state imaging device according to claim 1, wherein the inorganic phosphor comprises manganese-doped fluoride inorganic phosphor.

9. The solid-state imaging device according to claim 1, wherein the individual time constant of the inorganic phosphor, the light-emitting colorant, or the organic phosphor is smaller than the exposure time of the photoelectric conversion layer.

10. The solid-state imaging device of claim 1, wherein:

the first electrodes have a work function smaller than that of the conductive layer; and the first electrodes have a Fermi level higher than a valance band energy level of the conductive layer.

11. A solid-state imaging device comprising:

a first electrode;

a second electrode disposed opposed to the first electrode; and a photoelectric conversion layer, which is disposed between the first electrode and the second electrode and in which narrow gap semiconductor quantum dots are dispersed in a conductive layer, wherein, one electrode of the first electrode and the second electrode is a transparent electrode and the other electrode is a metal electrode or a transparent electrode, an inorganic phosphor, a light-emitting colorant, or an organic phosphor is dispersed in the conductive layer, the inorganic phosphor, the light-emitting colorant, or the organic phosphor in an amount larger than the amount of the narrow gap semiconductor quantum dots is dispersed at the center of the conductive layer in the thickness direction, and the narrow gap semiconductor quantum dots in an amount larger than the amount of the inorganic phosphor, the light-emitting colorant, or the organic phosphor are dispersed on the first electrode side and the second electrode side of the conductive layer.

12. A method for manufacturing a solid-state imaging device, the method comprising the steps of:

forming a charge accumulation layer on a silicon substrate;

forming a pixel electrode on the charge accumulation layer;

forming an insulating film covering the pixel electrode;

forming a plug, which is connected to the pixel electrode, in the insulating film;

forming a first electrode, which is connected to the plug, on the insulating film;

forming a conductive layer, in which (1) narrow gap semiconductor quantum dots and (2) an inorganic phosphor, a light-emitting colorant, or an organic phosphor is dispersed in the conductive layer on the first electrode, so as to form a photoelectric conversion layer; and forming a second electrode on the photoelectric conversion layer, wherein, one electrode of the first electrode and the second electrode is a transparent electrode and the other electrode is a metal electrode or a transparent electrode, the inorganic phosphor, the light-emitting colorant, or the organic phosphor in an amount larger than the amount of the narrow gap semiconductor quantum dots is dispersed at the center of the conductive layer in the thickness direction, and the narrow gap semiconductor quantum dots in an amount larger than the amount of the inorganic phosphor, the light-emitting colorant, or the organic phosphor are dispersed on the first electrode side and the second electrode side of the conductive layer.

13. An imaging apparatus comprising:

a light-condensing portion to condense incident light;

an imaging portion including a solid-state imaging device to receive and photoelectrically convert the light condensed with the light-condensing portion; and a signal processing portion to process the signal subjected to the photoelectrical conversion, wherein, the solid-state imaging device includes (a) a substrate with a plurality of pixels; (b) a plurality of charge accumulation regions in the substrate respectively corresponding to the pixels; (c) for each pixel, a pixel electrode on the substrate and over the respective charge accumulation region, the pixel electrode electrically coupled to the respective charge accumulation region; (d) for each pixel, a first electrode carried on the substrate and electrically connected to the respective pixel electrode, the first electrodes positioned in a common layer; (e) a second electrode disposed opposed to the first electrodes; (f) a photoelectric conversion layer common to all of the pixels, which is disposed between the first electrodes and the second electrode and in which narrow gap semiconductor quantum dots are dispersed in a conductive layer, the photoelectric conversion layer effective to convert incident light into electrical charges suitable for generating an image signal; and (g) for each pixel, a color filter over the respective charge accumulation region, each pixel is comprised of a respective first electrode, a portion of the photoelectric conversion layer, and the second electrode, charges generated by the photoelectric conversion layer based on light filtered by the color filters can be stored in the respective charge accumulation regions, the first electrodes are transparent electrodes and the second electrode is a transparent electrode or is a metal electrode, or the second electrode is a transparent electrode and the first electrodes are transparent electrodes or metal electrodes, an inorganic phosphor, a light-emitting colorant, or an organic phosphor is dispersed in the conductive layer, the inorganic phosphor, the light-emitting colorant, or the organic phosphor in an amount larger than the amount of the narrow gap semiconductor quantum dots is dispersed at the center of the conductive layer in the thickness direction, and the narrow gap semiconductor quantum dots in an amount larger than the amount of the inorganic phosphor, the light-emitting colorant, or the organic phosphor are dispersed on the first electrode side and the second electrode side of the conductive layer.

14. The solid-state imaging device of claim 13, wherein:
the first electrodes have a work function smaller than that of the conductive layer; and
the first electrodes have a Fermi level higher than a valance band energy level of the conductive layer.

* * * * *